(12) United States Patent
Lee et al.

(10) Patent No.: US 12,342,668 B2
(45) Date of Patent: Jun. 24, 2025

(54) DISPLAY DEVICE AND MANUFACTURING METHOD THEREOF

(71) Applicant: Samsung Display Co., LTD., Yongin-si (KR)

(72) Inventors: Hyun Sup Lee, Yongin-si (KR); Dong Chul Shin, Yongin-si (KR); Kang Young Lee, Yongin-si (KR); Gye Hwan Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 805 days.

(21) Appl. No.: 17/354,368

(22) Filed: Jun. 22, 2021

(65) Prior Publication Data

US 2022/0093678 A1 Mar. 24, 2022

(30) Foreign Application Priority Data

Sep. 23, 2020 (KR) ........................ 10-2020-0123294

(51) Int. Cl.
*H10H 29/14* (2025.01)
*H10H 20/01* (2025.01)
(Continued)

(52) U.S. Cl.
CPC ...... *H10H 29/142* (2025.01); *H10H 20/8312* (2025.01); *H10H 20/833* (2025.01);
(Continued)

(58) Field of Classification Search
CPC ... H01L 27/156; H01L 33/382; H01L 33/405; H01L 33/42; H01L 33/44; H01L 33/62;
(Continued)

(56) References Cited

U.S. PATENT DOCUMENTS 8,987,765 B2 3/2015 Bibl et al.
9,373,671 B2 6/2016 You
(Continued)

FOREIGN PATENT DOCUMENTS

KR 10-2015-0049639 5/2015
KR 20150049639 A * 5/2015
(Continued)

OTHER PUBLICATIONS

Wu et al, CN 110289254A, Micro-light Emitting Diode and Preparation Method Thereof, Jun. 27, 2019 (Year: 2019).*

*Primary Examiner* — Alexander G Ghyka
(74) *Attorney, Agent, or Firm* — KILE PARK REED & HOUTTEMAN PLLC

(57) ABSTRACT

A display device includes pixels. Each of the pixels includes light emitting elements including a first end portion and a second end portion disposed in a length direction; an intermediate layer that exposes a portion of each of the light emitting elements and fixes each of the light emitting elements in the length direction; a pixel circuit layer including at least one transistor electrically connected to one of the first end portion and the second end portion of each of the light emitting elements; a first electrode disposed on the at least one transistor and electrically connected to the a least one transistor; and a second electrode electrically connected to the other of the first end portion and the second end portion of each of the light emitting elements. The first electrode and the second electrode include different materials and are disposed in different layers.

17 Claims, 24 Drawing Sheets

(51) Int. Cl.
*H10H 20/831* (2025.01)
*H10H 20/832* (2025.01)
*H10H 20/833* (2025.01)
*H10H 20/84* (2025.01)
*H10H 20/857* (2025.01)

(52) U.S. Cl.
CPC .......... *H10H 20/835* (2025.01); *H10H 20/84* (2025.01); *H10H 20/857* (2025.01); *H10H 20/032* (2025.01); *H10H 20/034* (2025.01)

(58) Field of Classification Search
CPC ..... H01L 2933/0016; H01L 2933/0025; H01L 33/40; H01L 33/54; H01L 2933/005; H01L 25/0753; H01L 25/167; H01L 27/1214; H01L 33/0012
See application file for complete search history.

(56) References Cited

U.S. PATENT DOCUMENTS

| | | | |
|---|---|---|---|
| 10,276,630 | B2 | 4/2019 | Lee et al. |
| 10,707,377 | B2 | 7/2020 | Kim et al. |
| 2019/0198735 | A1 | 6/2019 | Tsai et al. |

FOREIGN PATENT DOCUMENTS

| | | | |
|---|---|---|---|
| KR | 10-2016-0010537 | | 1/2016 |
| KR | 20160010537 A | * | 1/2016 |
| KR | 10-2018-0011404 | | 2/2018 |
| KR | 10-2019-0122118 | | 10/2019 |
| KR | 10-2020-0066438 | | 6/2020 |

* cited by examiner

DISPLAY DEVICE AND MANUFACTURING METHOD THEREOF

CROSS-REFERENCE TO RELATED APPLICATION(S)

This application claims priority to and benefits of Korean Patent Application No. 10-2020-0123294 under 35 U.S.C. § 119 filed on Sep. 23, 2020 in the Korean Intellectual Property Office, the entire contents of which are incorporated herein by reference.

BACKGROUND

(a) Technical Field

The disclosure relates to a display device and a manufacturing method thereof.

(b) Description of the Related Art

The demand for the commercialization of display devices has been increasing as a result of increasing interest in information displays and increasing demands for portable information displays.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that may improve light emission efficiency.

In addition, the disclosure provides a manufacturing method of the above-mentioned display device.

An embodiment provides a display device including a plurality of pixels. Each of the plurality of pixels may include light emitting elements including a first end portion and a second end portion disposed in a length direction; an intermediate layer that exposes a portion of each of the light emitting elements and fixes each of the light emitting elements in the length direction; a pixel circuit layer including at least one transistor electrically connected to one of the first end portion and the second end portion of each of the light emitting elements; a first electrode disposed on the at least one transistor and electrically connected to the at least one transistor; and a second electrode electrically connected to the other of the first end portion and the second end portion of each of the light emitting elements. The first electrode and the second electrode may include different materials and may be disposed in different layers.

One of the first electrode and the second electrode may include a transparent conductive material, and the other of the first electrode and the second electrode may include an opaque conductive material.

The intermediate layer may include a curable material.

The pixel circuit layer may be disposed on the light emitting elements and the intermediate layer. The first electrode may be disposed above the light emitting elements, and the second electrode may be disposed below the light emitting elements; the first electrode may be disposed on the second electrode; and the light emitting elements may be disposed between the first electrode and the second electrode.

The first electrode may include a transparent conductive material, and the second electrode may include an opaque conductive material.

The second electrode may reflect light emitted from the light emitting elements in an upper direction of the light emitting elements.

Each of the light emitting elements may include a first semiconductor layer contacting the first electrode and electrically connected to the first electrode; a second semiconductor layer contacting the second electrode and electrically connected to the second electrode; and an active layer disposed between the first semiconductor layer and the second semiconductor layer. The first semiconductor layer may be a p-type semiconductor layer doped with a p-type dopant, and the second semiconductor layer may be an n-type semiconductor layer doped with an n-type dopant.

The first end portion of each of the light emitting elements may be disposed at an upper end portion of a corresponding light emitting element along the length direction, the second end portion of each of the light emitting elements may be disposed at a lower end portion of the corresponding light emitting element along the length direction. The first semiconductor layer may be disposed at the first end portion of each of the light emitting elements, and the second semiconductor layer may be disposed at the second end portion of each of the light emitting elements.

The pixel circuit layer may include at least one insulating layer. The at least one insulating layer may include a first opening in which a portion may be removed from an area overlapping the light emitting elements. The first electrode may be disposed on the first end portion of each of the light emitting elements within the first opening of the at least one insulating layer.

The display device may further include a conductive pattern disposed on at least a portion of the first electrode within the first opening of the at least one insulating layer. The conductive pattern may not overlap the light emitting elements in a cross-sectional view.

The display device may further include a bank disposed between the second electrode and the pixel circuit layer, surrounding the light emitting elements, and including a second opening exposing a portion of the second electrode; a first passivation layer overlapping the first electrode; a second passivation layer disposed on the first passivation layer; and a third passivation layer overlapping the second electrode. The intermediate layer may fill the second opening of the bank, and may include a groove exposing the first end portion of each of the light emitting elements.

The first opening of the at least one insulating layer may coincide with the second opening of the bank.

The intermediate layer may be disposed between the second electrode and the pixel circuit layer, and may expose the first end portion of each of the light emitting elements.

The pixel circuit layer may be disposed between the bank and the encapsulation layer and may include a light blocking member overlapping the at least one transistor.

The display device may further include a substrate on which the plurality of pixels may be disposed.

The pixel circuit layer may be disposed between the substrate and the light emitting elements; the first electrode may be disposed below the light emitting elements, the second electrode may be disposed above the light emitting elements; and the second electrode may be disposed on the first electrode; and the light emitting elements may be disposed between the first electrode and the second electrode.

The first electrode may include an opaque conductive material, the second electrode may include a transparent conductive material. The first electrode may reflect light emitted from the light emitting elements in an upper direction of the light emitting elements.

Each of the light emitting elements may include a p-type semiconductor layer doped with a p-type dopant, the p-type semiconductor layer contacting the first electrode and electrically connected to the first electrode; a n-type semiconductor layer doped with a n-type dopant, n-type semiconductor layer contacting the second electrode and electrically connected to the second electrode; and an active layer disposed between the p-type semiconductor layer and the n-type semiconductor layer. The first end portion of each of the light emitting elements may be disposed at a lower end portion of a corresponding light emitting element along the length direction, and the second end portion of each of the light emitting elements may be disposed at an upper end portion of the corresponding light emitting element along the length direction. The p-type semiconductor layer may be disposed at the first end portion of each of the light emitting elements, and the n-type semiconductor layer may be disposed at the second end portion of each of the light emitting elements.

An embodiment provides a manufacturing method of a display device, that may include forming a lower electrode on a first surface of a first substrate; forming an auxiliary insulating layer on the lower electrode and the first surface of the first substrate; forming a bank on the lower electrode, the bank including a first opening exposing the auxiliary insulating layer; supplying a solution and light emitting elements dispersed in the solution into the first opening of the bank; preparing a second substrate including an upper electrode disposed on a surface; disposing the second substrate on the first substrate so that the upper electrode faces the bank and the solution; applying an alignment signal to each of the lower electrode and the upper electrode to form an electric field in a vertical direction between the lower electrode and the upper electrode to align the light emitting elements, a length direction of each of the light emitting elements being parallel to the vertical direction; curing the solution to form an intermediate layer; exposing the intermediate layer and the bank by removing the second substrate including the upper electrode through a first laser lift-off process; forming a pixel circuit layer including at least one transistor and at least one insulating layer on the intermediate layer and the exposed bank; removing a portion of the at least one insulating layer to expose a portion of the intermediate layer; removing a portion of the exposed intermediate layer to expose an end portion of each of the light emitting elements; forming a first electrode electrically connected to the exposed one end portion of the light emitting elements; forming a first passivation layer on the first electrode; vertically rotating the first substrate so that a second surface facing the first surface of the first substrate is upwardly directed; exposing the another end portion of each of the light emitting elements by removing the first substrate including the lower electrode by a second laser lift-off process; forming a second electrode on the another end portion of each of the light emitting elements and forming a second passivation layer on the second electrode; and vertically rotating the second passivation layer so that the pixel circuit layer faces upward and the light emitting elements face downward.

The first electrode may include a transparent conductive material, and the second electrode may include an opaque conductive material.

Each of the light emitting elements may include a p-type semiconductor layer doped with a p-type dopant, the p-type semiconductor layer contacting the first electrode and electrically connected to the first electrode; a n-type semiconductor layer doped with a n-type dopant, the n-type semiconductor layer contacting the second electrode and electrically connected to the second electrode; an active layer disposed between the p-type semiconductor layer and the n-type semiconductor layer, the end portion of each of the light emitting elements may be disposed at an upper end portion of a corresponding light emitting element along the length direction, the another end portion of each of the light emitting elements may be disposed at a lower end portion of the corresponding light emitting element along the length direction, the p-type semiconductor layer coincides with the end portion of each of the light emitting elements, and the n-type semiconductor layer coincides with the another end portion of each of the light emitting elements.

According to the display device and the manufacturing method thereof according to an embodiment, it is possible to further secure an amount (or intensity) of light directed in an image display direction by arranging light emitting elements in a length direction to reduce loss of light emitted from each light emitting element, thereby improving an emission efficiency.

For example, according to the above-described embodiment, a display device of high resolution and high definition may be easily implemented by reducing an area occupied by each light emitting element between a first electrode (or pixel electrode) and a second electrode (or common electrode).

An effect according to an embodiment of the disclosure is not limited by what is illustrated in the above, and more various effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
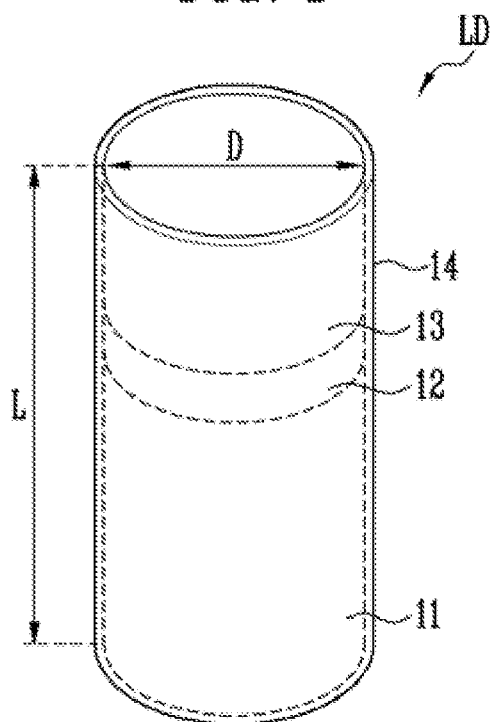
FIG. 1 illustrates a schematic perspective view of a light emitting element according to an embodiment.

Since the disclosure may be variously modified and have various forms, embodiments will be illustrated and described in detail. However, the disclosure is not limited to the embodiments, and it is to be understood to include all changes, equivalents, and substitutes within the spirit and the scope of the disclosure.

Like reference numerals are used for like constituent elements in describing each drawing. In the accompanying drawings, sizes, thicknesses, ratios, and dimensions of the elements may be exaggerated for ease of description and for clarity. Terms such as first, second, and the like are used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the disclosure. Singular forms are intended to include plural forms unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In the application, it should be understood that the term "include", "comprise", "have", or "configure", and variations thereof, indicates that a feature, a number, a step, an operation, a constituent element, a part, or a combination thereof described in the specification is present, but does not exclude a possibility of the presence or the addition of one or more other features, numbers, steps, operations, constituent elements, parts, or combinations.

It will be understood that when an element such as a layer, film, region, or substrate is referred to as being "on" another element, it can be directly on the other element or intervening elements may also be present. For example, in the specification, when an element of a layer, film, region, plate, or the like is referred to as being formed "on" another element, the formed direction is not limited to an upper direction but includes a lateral or lower direction. In contrast, when an element of a layer, film, region, plate, or the like is referred to as being "below" another element, it may be directly below the other element, or intervening elements may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It is to be understood that, in the application, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third or other constituent element). In contrast, it is to be understood that when it is described for one constituent element (for example, a first constituent element) to be "directly coupled or connected with/to" another constituent element (for example, a second constituent element), there is no other constituent element (for example, a third or other constituent element) between the one constituent element and the another constituent element.

Hereinafter, with reference to accompanying drawings, an embodiment of the disclosure and others required for those skilled in the art to understand the contents of the disclosure will be described in more detail. In the description below, singular forms are to include plural forms unless the context clearly indicates only the singular.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
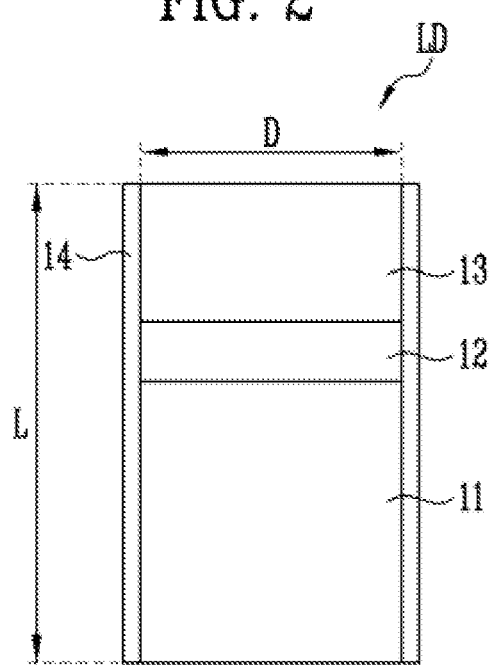
FIG. 2 illustrates a schematic cross-sectional view of the light emitting element of FIG. 1.

FIG. 1 illustrates a schematic perspective view of a light emitting element according to an embodiment, and FIG. 2 illustrates a schematic cross-sectional view of the light emitting element of FIG. 1.

In an embodiment, a type and/or shape of a light emitting element is not limited to embodiments shown in FIG. 1 and FIG. 2.

Referring to FIG. 1 and FIG. 2, a light emitting element LD may include a first semiconductor layer 11, a second semiconductor layer 13, and an active layer 12 interposed between the first and second semiconductor layers 11 and 13. For example, the light emitting element LD may be implemented as a stacked light emitting body in which the first semiconductor layer 11, the active layer 12, and the second semiconductor layer 13 may be sequentially stacked each other.

The light emitting element LD may be provided to have a shape extending in one or a direction. In a case that the extending direction of the light emitting element LD is a length direction, the light emitting element LD may include one or an end portion (or lower end portion) and the other end portion (or upper end portion) along the extending direction. One of the first and second semiconductor layers 11 and 13 may be disposed at one or an end portion (or lower end portion) of the light emitting element LD, and the remaining semiconductor layers of the first and second semiconductor layers 11 and 13 may be disposed at the other end portion (or upper end portion) of the light emitting element LD. For example, the first semiconductor layer 11 may be disposed at one or an end portion (or lower end portion) of the light emitting element LD, and the second semiconductor layer 13 may be disposed at the other end portion (or upper end portion) of the light emitting element LD.

The light emitting element LD may be provided in various shapes. For example, the light emitting element LD may have a substantially rod-like shape or a substantially bar-like shape that may be long in a length L direction (for example, an aspect ratio may be greater than 1). In an embodiment, a length L of the light emitting element LD in the length L direction may be larger than a diameter D thereof (or a width of a cross-section thereof). For example, the light emitting element LD may include a light emitting diode (LED) manufactured in an ultra-small size having a diameter D and/or length L of a nano scale to a micro scale.

The diameter D of the light emitting element LD may be in a range of about 0.5 μm to about 500 μm, and the length L thereof may be in a range of about 1 μm to about 10 μm. However, the diameter D and the length L of the light emitting element LD are not limited thereto, and the size of the light emitting element LD may be changed so that the light emitting element LD meets requirements (or design conditions) of a lighting device or a self-luminous display device to which the light emitting element LD may be applied.

For example, the first semiconductor layer 11 may include at least one n-type semiconductor layer. For example, the first semiconductor layer 11 may include a semiconductor material of one of InAlGaN, GaN, AlGaN, InGaN, AlN, and InN, and may be a n-type semiconductor layer doped with a first conductive dopant (or n-type dopant) such as Si, Ge, Sn, or the like within the spirit and the scope of the disclosure. However, the material included in the first semiconductor layer 11 is not limited thereto, and the first semiconductor layer 11 may be made of various materials. In an embodiment, the first semiconductor layer 11 may include a gallium nitride (GaN) semiconductor material doped with the first conductive dopant (or n-type dopant). The first semiconductor layer 11 may include an upper surface contacting the active layer 12 along the direction of the length L of the light emitting device LD and a lower surface exposed to the outside. The lower surface of the first semiconductor layer 11 may be one or an end portion (or lower end portion) of the light emitting element LD.

The active layer 12 is disposed on the first semiconductor layer 11, and may be formed to have a single or multi-quantum well structure. For example, in a case that the active layer 12 is formed of a multi-quantum well structure, the active layer 12 may have a structure in which a barrier layer (not shown), a strain reinforcing layer, and a well layer, which consist of one or a unit, may be periodically and repeatedly stacked each other. Since the strain reinforcing layer has a smaller lattice constant than that of the barrier layer, it may further reinforce strain applied to the well layer, for example, compressive strain. However, the structure of the active layer 12 is not limited to the above-described embodiment.

The active layer 12 may emit light having a wavelength in a range of about 400 nm to about 900 nm, and may have a double hetero-structure. In an embodiment, a cladding layer (not shown) doped with a conductive dopant may be formed on upper and/or lower portions of the active layer 12 along the direction of the length L of the light emitting element LD. For example, the clad layer may be formed as an AlGaN layer or an InAlGaN layer. In an embodiment, a material such as AlGaN and InAlGaN may be used to form the active layer 12, and for example, various materials may form the active layer 12. The active layer 12 may include a first surface contacting the first semiconductor layer 11 and a second surface contacting the second semiconductor layer 13.

In a case that an electric field of a predetermined voltage or more is applied to respective end portions of the light emitting element LD, the light emitting element LD emits light while electron-hole pairs are combined in the active layer 12. By controlling the light emission of the light emitting element LD by using this principle, the light emitting element LD may be used as a light source (or light emitting source) for various light emitting devices in addition to pixels of a display device.

The second semiconductor layer 13 is disposed on the second surface of the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or p-type dopant) such as Mg. However, the material included in the second semiconductor layer 13 is not limited thereto, and the second semiconductor layer 13 may be formed of various materials. In an embodiment, the second semiconductor layer 13 may include a gallium nitride (GaN) semiconductor material doped with the second conductive dopant (or p-type dopant). The second semiconductor layer 13 may include a lower surface contacting the second surface of the active layer 12 along the length L direction of the light emitting element LD and an upper surface exposed to the outside. Here, the upper surface of the second semiconductor layer 13 may be the other end portion (or upper end portion) of the light emitting element LD.

In an embodiment, the first semiconductor layer 11 and the second semiconductor layer 13 may have different thicknesses from each other in the length L direction of the light emitting element LD. For example, the first semiconductor layer 11 may have a relatively thicker thickness than that of the second semiconductor layer 13 along the length L direction of the light emitting element LD. Accordingly, the active layer 12 of the light emitting element LD may be disposed to be closer to the upper surface of the second semiconductor layer 13 than the lower surface of the first semiconductor layer 11.

It is illustrated that each of the first semiconductor layer 11 and the second semiconductor layer 13 are formed as one or a layer, but the disclosure is not limited thereto. In an embodiment, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the disclosure is not limited thereto.

In an embodiment, the light emitting element LD may further include an additional electrode (hereinafter referred to as a 'first additional electrode') (not shown) disposed on the second semiconductor layer 13 in addition to the first semiconductor layer 11, the active layer 12, and the second semiconductor layer 13 described above. For example, in an embodiment, another additional electrode (not shown, hereinafter referred to as a "second additional electrode") disposed on one or an end of the first semiconductor layer 11 may be further included.

Each of the first and second additional electrodes may be an ohmic contact electrode, but the disclosure is not limited thereto. In an embodiment, the first and second additional electrodes may be a schottky contact electrode. The first and second additional electrodes may contain a conductive material. For example, the first and second additional electrodes may include an opaque metal in which chromium (Cr), titanium (Ti), aluminum (Al), gold (Au), nickel (Ni), and an oxide or alloy thereof are used alone or in combination, but the disclosure is not limited thereto. In an embodiment, the first and second additional electrodes may include a transparent conductive oxide such as an indium tin oxide (ITO), an indium zinc oxide (IZO), a zinc oxide (ZnO), an indium gallium zinc oxide (IGZO), and an indium tin zinc oxide (ITZO).

Materials included in the first and second additional electrodes may be the same or different from each other. The first and second additional electrodes may be substantially transparent or translucent. Accordingly, light generated by the light emitting element LD may transmit through each of the first and the second additional electrodes to be outputted to the outside of the light emitting element LD. In an embodiment, in a case that the light generated by the light emitting element LD does not transmit through the first and the second additional electrodes and is discharged to the outside through a region except for respective end portions of the light emitting element LD, the first and the second additional electrodes may include an opaque metal.

In an embodiment, the light emitting element LD may further include an insulating film 14. However, in an embodiment, the insulating film 14 may be omitted, or it may be provided or disposed so as to cover or overlap only some or a number of the first semiconductor layer 11, the active layer 12, and the second semiconductor layer 13.

The insulating film 14 may prevent an electrical short circuit that may occur in a case that the active layer 12 contacts conductive materials other than the first and second semiconductor layers 11 and 13. For example, the insulating film 14 may minimize surface defects of the light emitting element LD to improve lifespan and luminous efficiency of the light emitting element LD. For example, in a case that a plurality of light emitting elements LD are closely disposed, the insulating film 14 may prevent unwanted short circuits that may occur between the light emitting elements LD. As long as the active layer 12 may prevent a short circuit with an external conductive material from being caused, whether or not the insulating film 14 is provided is not limited.

The insulating film 14 may be provided or disposed to entirely surround an outer circumferential surface of a light emitting stacked structure including the first semiconductor layer 11, the active layer 12, and the second semiconductor layer 13.

In the above-described embodiment, the structure in which the insulating film 14 entirely surrounds the outer circumferential surfaces of the first semiconductor layer 11, the active layer 12, and the second semiconductor layer 13 is described, but the disclosure is not limited thereto. In an embodiment, in a case that the light emitting element LD may include a first additional electrode, the insulating film 14 may entirely surround the outer circumferential surface each of the first semiconductor layer 11, the active layer 12, the second semiconductor layer 13, and the first additional electrode. For example, according to an embodiment, the insulating film 14 may not entirely surround the outer circumferential surface of the first additional electrode, or may only surround a portion of the outer circumferential surface of the first additional electrode and may not surround the remaining portion of the external circumferential surface of the first additional electrode. For example, in an embodiment, in a case that the first additional electrode is disposed at the other end portion (or an upper end portion) of the light emitting element LD and a second additional electrode is disposed at one or an end portion (or a lower end portion) of the light emitting element LD, the insulating film 14 may expose at least one or a region of each of the first and second additional electrodes.

The insulating film 14 may include a transparent insulating material. For example, the insulating film 14 may include one or more insulating material of a silicon oxide (SiO$_x$), a silicon nitride (SiN$_x$), a silicon oxynitride (SiO$_x$N$_y$), an aluminum oxide (AlO$_x$), and a titanium oxide (TiO$_x$), but the disclosure is not limited thereto, and various materials having insulating properties may be used as the material of the insulating film 14.

The insulating film 14 may be provided as a single layer, or may be provided as a multilayer including at least a double film. For example, in a case that the insulating film 14 is configured as a double film including a first layer and a second layer that may be sequentially stacked each other, the first layer and the second layer may be made of different materials (or substances), and may be formed by different processes. In an embodiment, the first layer and the second layer may contain the same or similar material.

In an embodiment, the light emitting element LD may be implemented in a light emitting pattern having a core-shell structure. The above-described first semiconductor layer 11 may be positioned at a core, for example, a middle (or center) of the light emitting element LD, and the active layer 12 may be provided or disposed and/or formed to surround the outer circumferential surface of the first semiconductor layer 11, and the second semiconductor layer 13 may be provided or disposed and/or formed to surround the active layer 12. For example, the light emitting element LD may further include an additional electrode (not shown) surrounding at least one or a side of the second semiconductor layer 13. For example, in an embodiment, the light emitting element LD may further include the insulating film 14 provided or disposed on the outer circumferential surface of the light emitting pattern having a core-shell structure and including a transparent insulating material. The light emitting element LD implemented in the light emitting pattern having the core-shell structure may be manufactured by a growth method.

The above-described light emitting element LD may be used as a light emitting source (or light source) for various display devices. The light emitting element LD may be manufactured through a surface treatment process. For example, in a case that the plurality of light emitting elements LD are mixed with a fluid solution (or a solvent) and supplied to each pixel area (for example, a light emitting area of each pixel or a light emitting area of each sub pixel), each light emitting element LD may be surface-treated so that the light emitting elements LD may not be non-uniformly aggregated in the solution and may be uniformly sprayed.

A light emitting unit (or light emitting device) including the above-described light emitting element LD may be used in various types of electronic devices that require a light source in addition to the display device. For example, in a case that a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
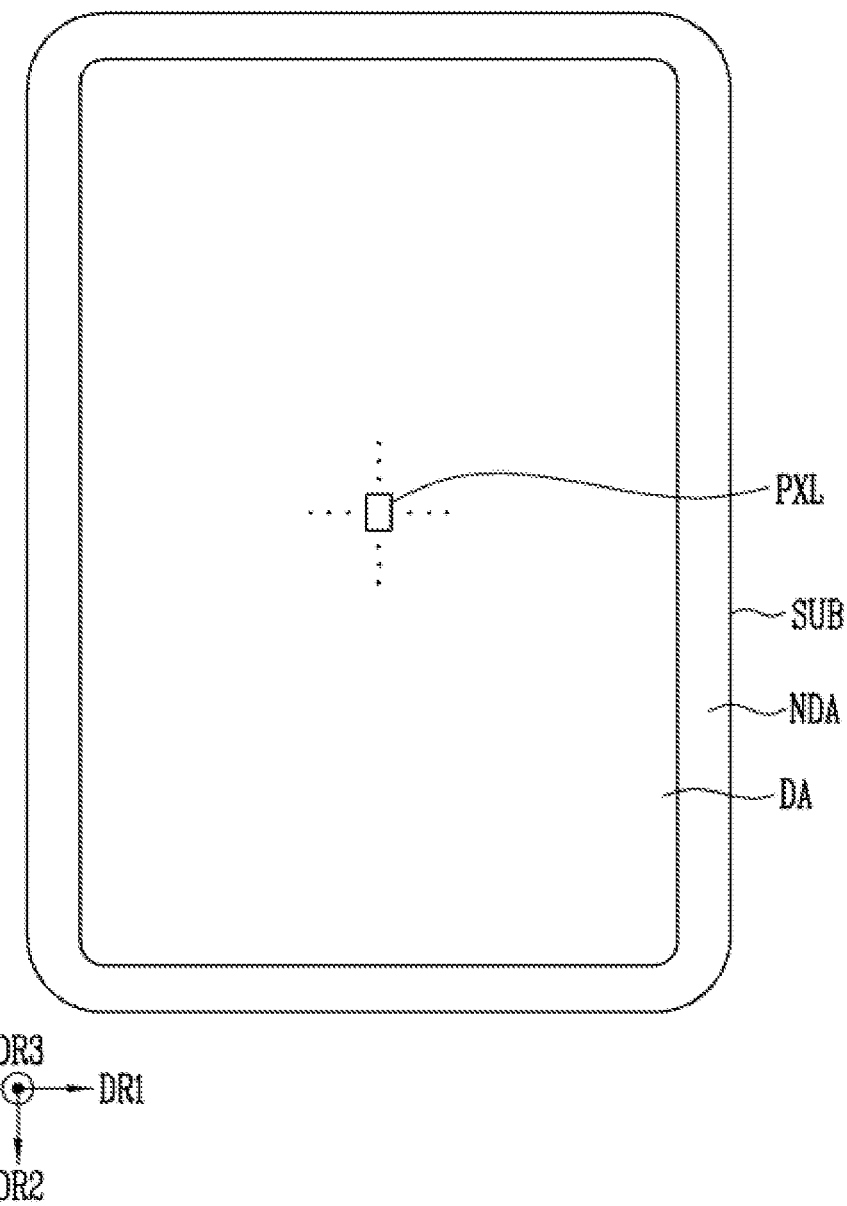
FIG. 3 illustrates a display device according to an embodiment, for example, a schematic top plan view of a display device using the light emitting elements shown in FIG. 1 and FIG. 2 as a light source.

FIG. 3 illustrates a display device according to an embodiment, for example, a schematic top plan view of a display device using the light emitting elements shown in FIG. 1 and FIG. 2 as a light source.

In FIG. 3, for convenience, a structure of the display device is briefly illustrated based on a display area DA on which an image is displayed.

Referring to FIG. 1 to FIG. 3, the display device according to an embodiment of the disclosure may include a substrate SUB, a plurality of pixels PXL provided or disposed on the substrate SUB and respectively including at least one light emitting element LD, a driver provided or disposed on the substrate SUB and driving the pixels PXL, and a wire part electrically connecting the pixels PXL and the driver.

In a case that the display device is one in which a display surface is applied to at least one or a surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the disclosure may be applied thereto.

The display device may be classified into a passive matrix type display device and an active matrix type display device according to a method of driving the light emitting element LD. For example, in a case that the display device is implemented as the active matrix type display device, each of the pixels PXL may include a driving transistor for controlling an amount of current supplied to the light emitting element LD, a switching transistor for transmitting a data signal to the driving transistor, and the like within the spirit and the scope of the disclosure.

The display device may be provided in various shapes, and as an example, may be provided in a substantially rectangular plate shape having two pairs of sides parallel to each other, but the disclosure is not limited thereto. In a case that the display device is provided in the substantially rectangular plate shape, one of the two pairs of sides may be provided to be longer than the other a pair of sides. For better understanding and ease of description, a case in which the display device has a substantially rectangular shape with a pair of long sides and a pair of short sides is illustrated, and an extending direction of the long side is indicated as the second direction DR2, an extending direction of the short side is indicated as the first direction DR1, and a direction perpendicular to the extending directions of the long and short sides is indicated as the third direction DR3. The display device provided in the substantially rectangular plate shape may have a substantially round shape at a corner portion where one or a long side and one or a short side contact (or meet), but the disclosure is not limited thereto.

The substrate SUB may include a display area DA and a non-display area NDA.

The display area DA may be an area in which the pixels PXL for displaying an image may be provided or disposed. The non-display area NDA may be an area in which the driver for driving the pixels PXL and a portion of the wire part for electrically connecting the driving and the pixels PXL may be provided or disposed. For better understanding and ease of description, only one pixel PXL is shown in FIG. 3, but a plurality of pixels PXL may be substantially provided or disposed in the display area DA of the substrate SUB.

The non-display area NDA may be provided or disposed in at least one or a side of the display area DA. The non-display area NDA may surround or be adjacent to a circumference (or edge) of the display area DA. The non-display area NDA may be provided with a wire part electrically connected to the pixels PXL and a driver for driving the pixels PXL.

The wire part may electrically connect the driver and the pixels PXL. The wire part provides a signal to each pixel PXL, and it may be signal lines electrically connected to each pixel PXL, for example, a fan-out line electrically connected to a scan line, a data line, a light emitting control line, and the like within the spirit and the scope of the disclosure. For example, the wire part is a fan-out line electrically connected to signal lines electrically connected to each pixel PXL, for example, electrically connected to a control line, a sensing line, and the like, in order to compensate for changes in electrical characteristics of each pixel PXL in real time.

The substrate SUB may include a transparent insulating material to transmit light. The substrate SUB may be a rigid substrate or a flexible substrate.

One or an area on the substrate SUB may be provided as the display area DA in which pixels PXL may be disposed, and the remaining area on the substrate SUB may be provided as the non-display area NDA. For example, the substrate SUB may include the display area DA including pixel areas in which respective pixels PXL may be disposed, and the non-display area NDA disposed around the display area DA (or adjacent to the display area DA).

Each of the pixels PXL may be provided or disposed in the display area DA on the substrate SUB. In an embodiment, the pixels PXL may be arranged or disposed in the display area DA in a stripe or PenTile® arrangement structure, but the disclosure is not limited thereto.

Each pixel PXL may include at least one or more light emitting element LD driven by corresponding scan and data signals. The light emitting element LD may have a size as small as a nano-scale to a micro-scale, and may be mutually electrically connected to light emitting elements disposed adjacent, in parallel, but the disclosure is not limited thereto. The light emitting element LD may form a light source of each pixel PXL.

Each pixel PXL may include at least one light source, for example, the light emitting element LD shown in FIG. 1 driven by a predetermined signal (for example, a scan signal and a data signal) and/or a predetermined power source (for example, a first driving power source and a second driving power source). However, in an embodiment, the type of the light emitting element LD that may be used as the light source of each pixel PXL is not limited thereto.

The driver may provide a predetermined signal and a predetermined power source to each pixel PXL through the wire part, thereby controlling driving of the pixel PXL. The driver may include a scan driver, a light emission driver, and a data driver, and a timing controller.

Figure 4:
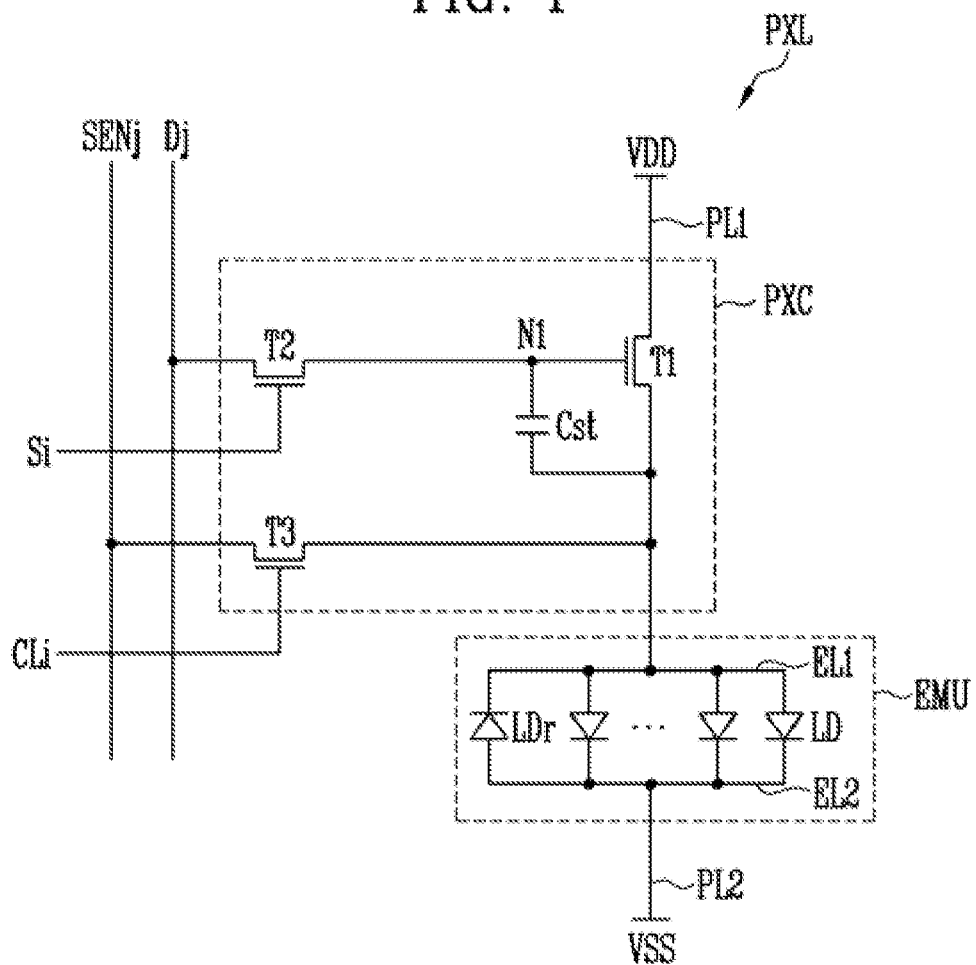
FIG. 4 illustrates an equivalent circuit diagram of an electrical connection relationship between constituent elements included in one pixel shown in FIG. 3 according to an embodiment.

FIG. 4 illustrates an equivalent circuit diagram of an electrical connection relationship between constituent elements included in one pixel shown in FIG. 3 according to an embodiment.

For example, FIG. 4 illustrates an electrical connection relationship between constituent elements included in a pixel PXL applicable to an active display device according to an embodiment. However, the types of constituent elements included in the pixel PXL to which an embodiment may be applied are not limited thereto.

In FIG. 4, not only the constituent elements included in each of the pixels PXL illustrated in FIG. 3 but also the area in which the constituent elements may be provided may be comprehensively referred to as the pixel PXL.

Referring to FIG. 1 to FIG. 4, one pixel PXL (hereinafter referred to as a 'pixel') may include a light emitting unit EMU that generates luminance light corresponding to a data signal. For example, the pixel PXL may further selectively include a pixel circuit PXC for driving the light emitting unit EMU.

In an embodiment, the light emitting unit EMU may include a plurality of light emitting elements LD electrically connected in parallel between the first power line PL1 to which the voltage of the first driving power source VDD may be applied and the second power line PL2 to which the voltage of the second driving power source VSS may be applied. For example, the light emitting unit EMU may include a first electrode EL1 (also referred to as a "first alignment electrode") electrically connected to the first power source VDD via the pixel circuit PXC and the first power line PL1, a second electrode EL2 (also referred to as a "second alignment electrode") electrically connected to the second power source VSS through the second power line PL2, and a plurality of light emitting elements LD electrically connected in parallel in the same direction between the first and second electrodes EL1 and EL2. In an embodiment, the first electrode EL1 may be an anode, and the second electrode EL2 may be a cathode.

Each of the light emitting elements LD included in the light emitting unit EMU may include one or an end portion electrically connected to the first driving power source VDD through the first electrode EL1 and the other or another end portion electrically connected to the second driving power source VSS through the second electrode EL2. The first driving power source VDD and the second driving power source VSS may have different potentials. For example, the first driving power source VDD may be set as a high potential power source, and the second driving power source VSS may be set as a low potential power source. A potential difference between the first and second driving power sources VDD and VSS may be set to be equal to or higher than a threshold voltage of the light emitting elements LD during a light emitting period of the pixel PXL.

As described above, respective light emitting elements LD electrically connected in parallel in the same direction (for example, a forward direction) between the first electrode EL1 and the second electrode EL2 respectively supplied with voltages of different potentials may form respective effective light source. These effective light sources may be collected to form the light emitting unit EMU of the pixel PXL.

The light emitting elements LD of the light emitting unit EMU may emit light with luminance corresponding to a driving current supplied through the corresponding pixel circuit PXC. For example, during each frame period, the pixel circuit PXC may supply a driving current corresponding to a gray value of corresponding frame data to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

An embodiment in which respective end portions of the light emitting elements LD may be electrically connected in the same direction between the first and second driving power sources VDD and VSS is illustrated, but the disclosure is not limited thereto. In an embodiment, the light emitting unit EMU may further include at least one ineffective light source, for example, a reverse light emitting element LDr, in addition to the light emitting elements LD forming respective effective light sources. The reverse light emitting element LDr may be electrically connected in parallel between the first and second electrodes EL1 and EL2 together with the light emitting devices LD forming the effective light sources, but may be electrically connected between the first and second electrodes EL1 and EL2 in the opposite direction with respect to the light emitting elements LD. The reverse light emitting element LDr maintains an inactive state even in a case that a predetermined driving voltage (for example, a driving voltage in the forward direction) is applied between the first and second electrodes EL1 and EL2, thus a current does not substantially flow in the reverse light emitting element.

The pixel circuit PXC may be electrically connected to a scan line Si and a data line Dj of the pixel PXL. For example, in a case that the pixel PXL is disposed in an i-th (i is a natural number) row and a j-th (j is a natural number) column of the display area DA, the pixel circuit PXC of the pixel PXL may be electrically connected to an i-th scan line Si and a j-th data line Dj of the display area DA. For example, the pixel circuit PXC may be electrically connected to an i-th control line CLi and a j-th sensing line SENj of the display area DA.

The pixel circuit PXC described above may include first to third transistors T1 to T3 and a storage capacitor Cst.

A first terminal of the first transistor T1 (driving transistor) may be electrically connected to the first driving power source VDD, and a second terminal thereof may be electrically connected to the first electrode EL1 of each of the light emitting elements LD. A gate electrode of the first transistor T1 may be electrically connected to a first node N1. The first transistor T1 may control an amount of driving current supplied to the light emitting elements LD in response to a voltage of the first node N1.

A first terminal of the second transistor T2 (switching transistor) may be electrically connected to the j-th data line Dj, and a second terminal thereof may be electrically connected to the first node N1. Here, the first terminal and the second terminal of the second transistor T2 are different terminals, and for example, in a case that the first terminal is a source electrode, the second terminal may be a drain electrode. For example, a gate electrode of the second transistor T2 may be electrically connected to the i-th scan line Si.

The second transistor T2 may be turned on when a scan signal of a voltage capable of turning on the second transistor T2 is supplied from the i-th scan line Si to electrically connect the j-th data line Dj and the first node N1. A data signal of a corresponding frame is supplied to the j-th data line Dj, and accordingly, the data signal is transmitted to the first node N1. The data signal transmitted to the first node N1 is charged in the storage capacitor Cst.

The third transistor T3 may be electrically connected between the first transistor T1 and the j-th sensing line SENj. For example, a first terminal of the third transistor T3 may be electrically connected to the first terminal (for example, source electrode) of the first transistor T1 electrically connected to the first electrode EL1, and a second terminal of the third transistor T3 may be electrically connected to the j-th sensing line SENj. A gate electrode of the third transistor T3 may be electrically connected to the i-th control line CLi. The third transistor T3 may be turned on by a control signal of a gate-on voltage supplied to the i-th control line CLi during a predetermined sensing period to electrically connect the j-th sensing line SENj to the first transistor T1.

The sensing period may be a period for extracting characteristic information (for example, a threshold voltage of the first transistor T1) of each of the pixels PXL disposed in the display area DA.

One or an electrode of the storage capacitor Cst may be electrically connected to the first driving power source VDD, and the other or another electrode may be electrically connected to the first node N1. The storage capacitor Cst may charge a voltage corresponding to the data signal supplied to the first node N1, and may maintain the charged voltage until a data signal of a next frame is supplied.

FIG. 4 discloses an embodiment in which all of the first to third transistors T1 to T3 are N-type transistors, but the disclosure is not limited thereto. For example, at least one of the first to third transistors T1 and T3 described above may be changed to a P-type transistor. For example, although FIG. 4 discloses an embodiment in which the light emitting unit EMU may be electrically connected between the pixel circuit PXC and the second driving power source VSS, the light emitting unit EMU may also be electrically connected between the first driving power source VDD and the pixel circuit PXC.

The structure of the pixel circuit PXC may be variously changed. For example, the pixel circuit PXC may additionally include other circuit elements such as at least one transistor element such as a transistor element for initializing the first node N1 and/or a transistor element for controlling a light emission time of the light emitting elements LD, or a boosting capacitor for boosting the voltage of the first node N1.

For example, FIG. 4 illustrate an embodiment in which the light emitting elements LD forming each light emitting unit EMU may all be electrically connected in parallel, but the disclosure is not limited thereto. In an embodiment, the light emitting unit EMU may include at least one series stage including a plurality of light emitting elements LD electrically connected in parallel to each other. For example, the light emitting unit EMU may have a series/parallel mixed structure.

The structure of the pixel PXL that may be applied to the disclosure is not limited to an embodiment illustrated in FIG. 4, and the corresponding pixel PXL may have various structures. For example, each pixel PXL may be configured inside a passive light emitting display device or the like within the spirit and the scope of the disclosure. The pixel circuit PXC may be omitted, and respective end portions of the light emitting elements LD included in the light emitting unit EMU may be electrically connected (or, directly electrically connected) to the i-th scan line Si, the j-th data line Dj, the first power line PL1 to which the first driving power source VDD is applied, the second power line PL2 to which the second driving power source VSS is applied, and/or a predetermined control line.

Figure 5:
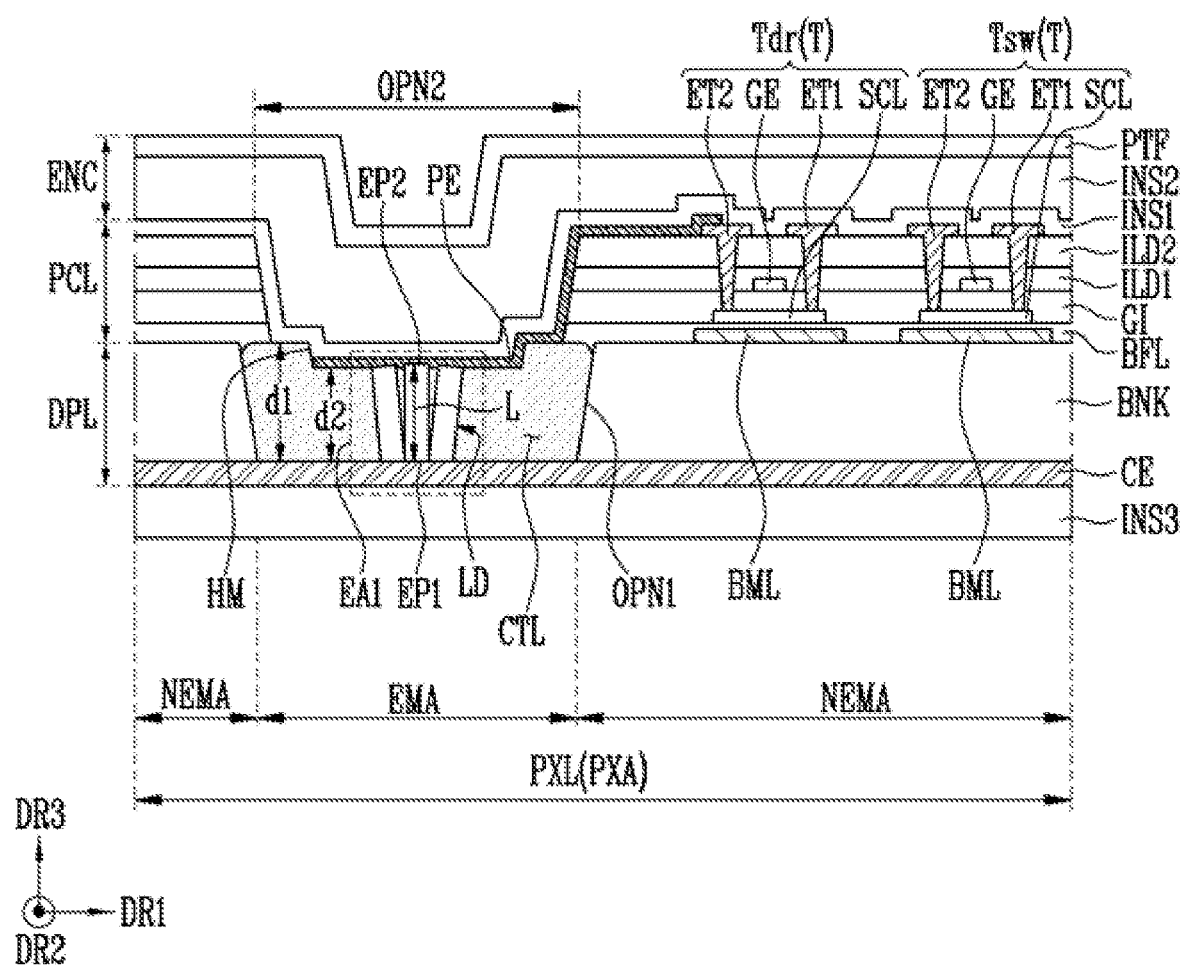
FIG. 5 to FIG. 7 illustrate schematic cross-sectional views of a pixel according to an embodiment.
Figure 6:
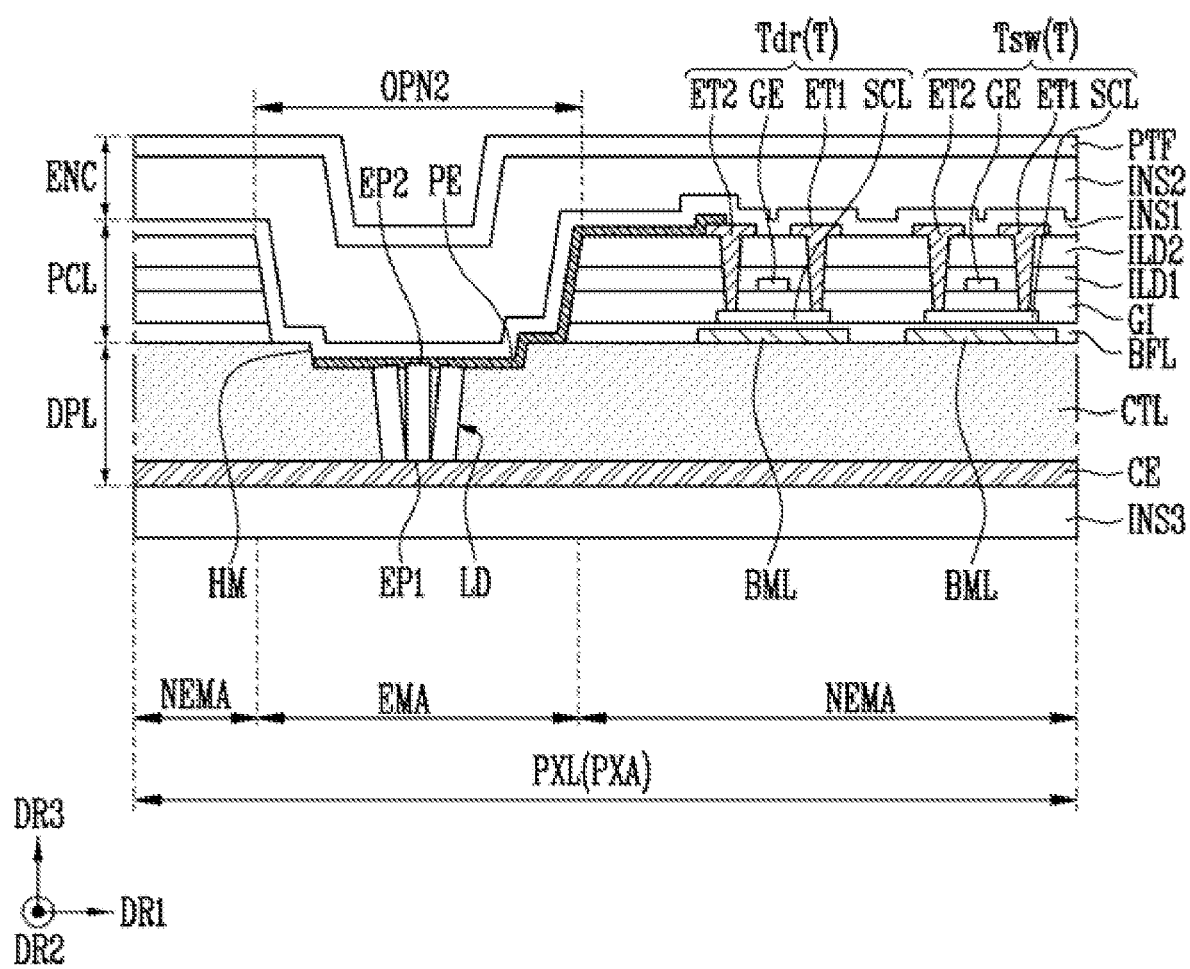
Figure 7:
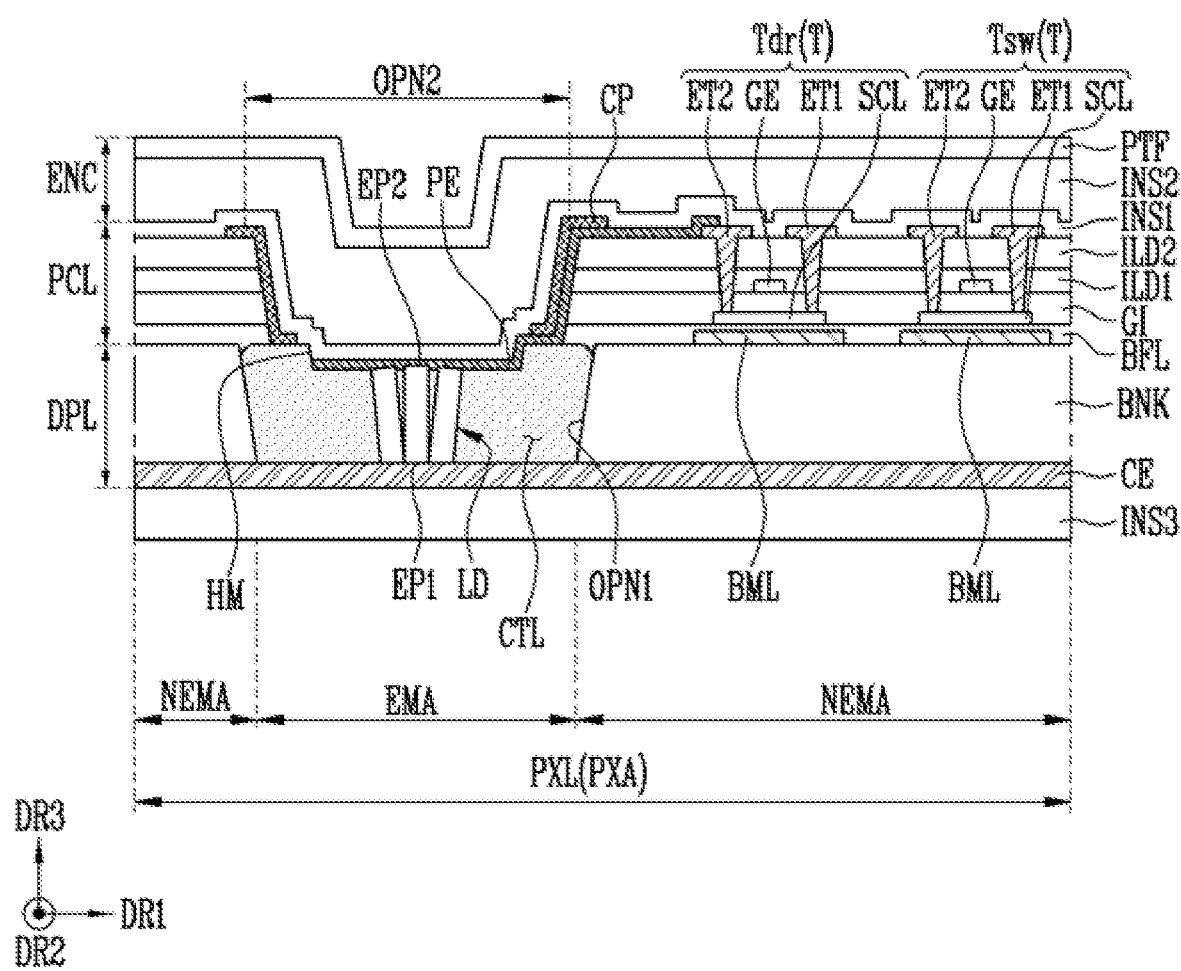
Figure 8A:
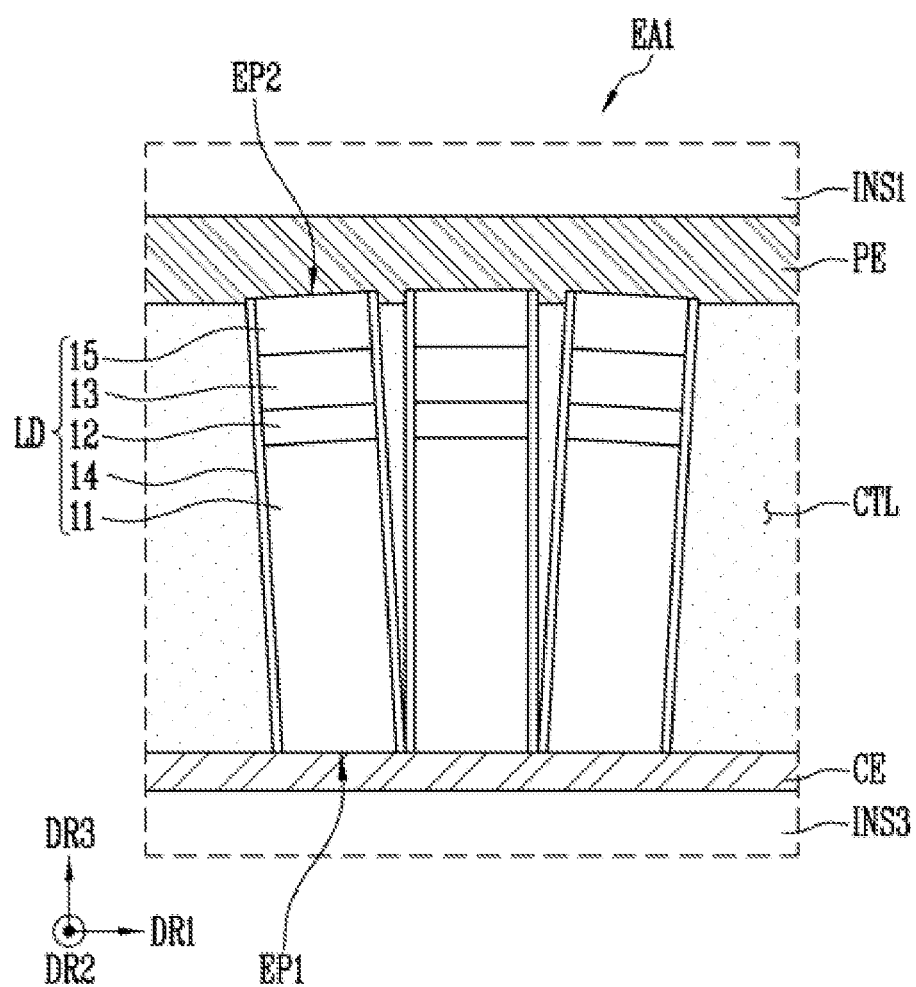
FIG. 8A and FIG. 8B illustrates schematic enlarged views of the portion EA1 of FIG. 5.
Figure 8B:
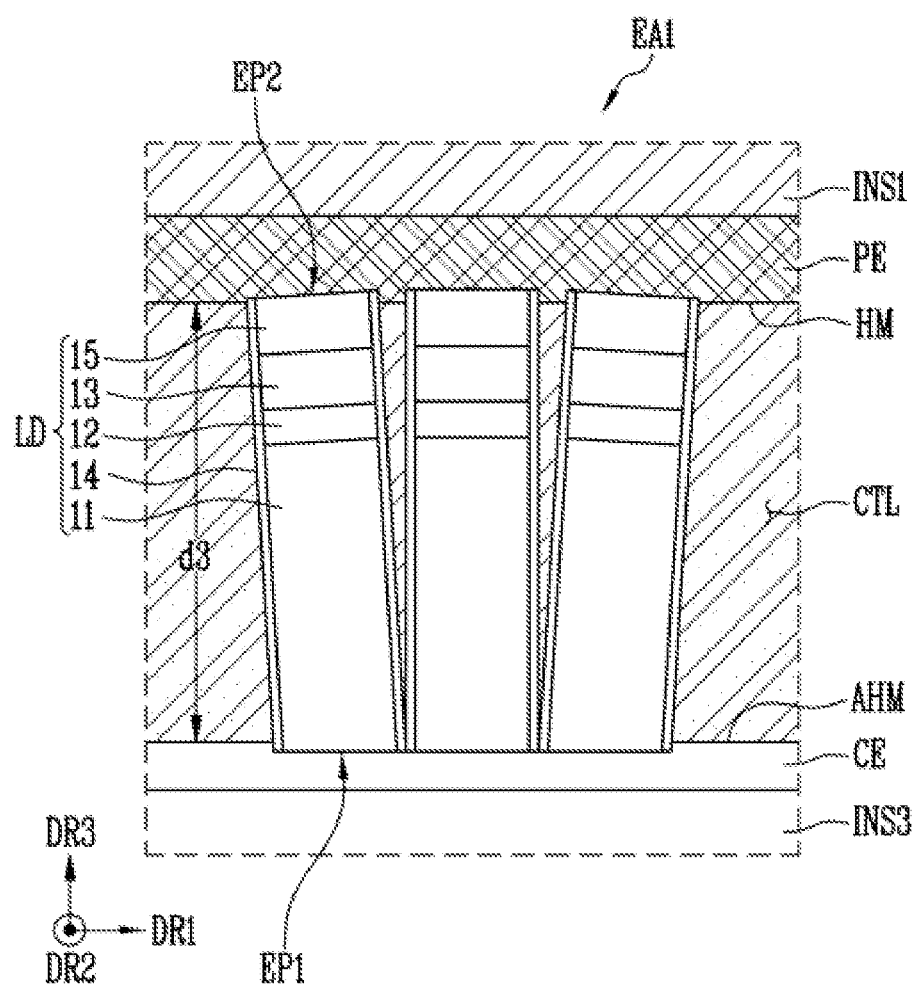

FIG. 5 to FIG. 7 illustrate schematic cross-sectional views of a pixel according to an embodiment, and FIG. 8A and FIG. 8B illustrates schematic enlarged views of the portion EA1 of FIG. 5.

In an embodiment, for better understanding and ease of description, a direction parallel to a main surface of a pixel circuit layer PCL in a cross-sectional view is indicated as the first direction DR1, a direction parallel to a length L direction of the light emitting elements LD in a cross-sectional view is indicated as the third direction DR3, and a direction perpendicular to the first and third directions DR1 and DR3 is indicated as the second direction DR2. The first to third directions DR1, DR2, and DR3 may mean directions indicated by the first to third directions DR1, DR2, and DR3, respectively.

In FIG. 5 to FIG. 8B, one pixel PXL is simplified by showing each electrode as an electrode of a single film and each insulating layer as an insulating layer of a single film, but the disclosure is not limited thereto.

In an embodiment, "connection" between two elements may mean both electrical and physical connections.

For example, in an embodiment, "formed and/or provided or disposed in the same layer" may mean that it is formed in the same process, and "formed and/or provided or disposed in a different layer" may mean that it is formed in different processes.

Referring to FIG. 5 to FIG. 8B, the pixel PXL according to an embodiment may include a third insulating layer INS3, a display element layer DPL, a pixel circuit layer PCL, and an encapsulation layer ENC. The third insulating layer INS3, the display element layer DPL, the pixel circuit layer PCL, and the encapsulation layer ENC may be disposed in a pixel area PXA in which the pixel PXL may be provided or disposed. The pixel area PXA may include a light emitting area EMA from which light is emitted and a non-light emitting area NEMA adjacent to the light emitting area EMA.

The third insulating layer INS3 may be provided or disposed and/or formed on one or a surface of the display element layer DPL to protect some or a number of constituent elements of the display element layer DPL, for example, a second electrode CE (or common electrode). The third insulating layer INS3 may be an inorganic insulating film including an inorganic material. For example, the third insulating layer INS3 may include at least one of metal oxides such as a silicon nitride ($SiN_x$), a silicon oxide ($SiO_x$), a silicon oxynitride ($SiO_xN_y$), and an aluminum oxide ($AlO_x$). However, the material of the third insulating layer INS3 is not limited to the above-described embodiments. In an embodiment, the third insulating layer INS3 may be an organic insulating film including an organic material. The third insulating layer INS3 may be provided as a single film, and may be provided as a multi-film of at least two or more layers.

The third insulating layer INS3 may be provided or disposed and/or formed on one or a surface (for example, a lower surface) of the display element layer DPL to entirely cover or overlap the second electrode CE (or common electrode).

The display element layer DPL may include a second electrode CE (or common electrode), a plurality of light emitting elements LD, and an intermediate layer CTL. The display element layer DPL may selectively include a bank BNK.

The second electrode CE (or common electrode) may be entirely provided or disposed on one or a surface of the third insulating layer INS3. The second electrode CE (or common electrode) may be a common layer commonly provided to the pixel PXL and pixels (not shown) adjacent to the pixel PXL. In an embodiment, the second electrode CE (or common electrode) may be a cathode. The second electrode CE (or common electrode) may have the same configuration as the second electrode EL2 described with reference to FIG. 4. Accordingly, the second electrode CE (or common electrode) may be electrically connected to the second driving power source (see 'VSS' in FIG. 4), so that a voltage of the second driving power source VSS may be transmitted to the second electrode CE (or common electrode). The second electrode CE (or common electrode) may be electrically connected to a driving voltage wire (not shown) disposed in the non-display area (see 'NDA' in FIG. 3) by using a separate connection element (for example, contact hole and bridge electrode, etc.) to receive a voltage of the second driving power source VSS applied to the driving voltage wire. In an embodiment, the second electrode (CE) (or common electrode) may be electrically connected (or, directly electrically connected) to an external driver to receive the voltage of the second driving power source VSS from the driver.

For example, the second electrode CE (or common electrode) may be a light guide member (or reflective member) that guides light emitted from the light emitting elements LD to an image display direction (for example, a front direction) of the display device. For this purpose, the second electrode CE (or common electrode) may be made of a conductive material (or substance) having a constant reflectivity. The conductive material (or substance) may include an opaque metal. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In an embodiment, the second electrode CE (or common electrode) may include a transparent conductive material (or substance). The transparent conductive material (or substance) may include a conductive oxide such as an indium tin oxide (ITO), an indium zinc oxide (IZO), a zinc oxide (ZnO), an indium gallium zinc oxide (IGZO), and an indium tin zinc oxide (ITZO), and a conductive polymer such as poly(3,4-ethylenedioxythiophene) (PEDOT). In a case that the second electrode CE (or common electrode) contains the transparent conductive material (or substance), a separate conductive layer made of an opaque metal may be added to reflect the light emitted from the light-emitting elements LD in the image display direction of the display device.

In an embodiment, the second electrode CE (or common electrode) may contact a portion of each of the light emitting elements LD to be electrically connected to each of the light emitting elements LD. For example, the second electrode CE (or common electrode) may contact a first end portion EP1 of each of the light emitting elements LD to be electrically connected to the light emitting elements LD.

The bank BNK may be disposed in the non-light emitting area NEMA of the pixel PXL. The bank BNK may have a structure that defines (or partitions) the pixel area PXA or the light emitting area EMA of each of the pixel PXL and pixels adjacent thereto (not shown), and for example, may be a pixel defining film. In an embodiment, the bank BNK may be a pixel defining film or a dam structure that defines the light emitting area EMA in which the light emitting elements LD should be supplied in a process of supplying (or injecting) light emitting elements LD to the pixel PXL. For example, as the light emitting area EMA of the pixel PXL is partitioned by the bank BNK, a solution (or mixed solution) including a target amount and/or type of light emitting elements LD may be supplied to (or injected into) the light emitting area EMA.

The bank BNK may include at least one light blocking material and/or reflective material to prevent a light leakage defect in which light leaks between the pixel PXL and pixels adjacent thereto. In an embodiment, the bank BNK may include a transparent material (or substance). The transparent material may include, for example, a polyamides resin, a polyimide resin, and the like, but the disclosure is not limited thereto. According to an embodiment, a reflective material layer may be separately provided or disposed and/or formed on the bank BNK to further improve an efficiency of light emitted from each of the pixels PXL.

The bank BNK may include an element disposed under or below the bank BNK in the pixel area PXA of the pixel PXL, for example, a first opening OPN1 exposing a portion of the second electrode CE (or common electrode). In an embodiment, the light emitting area EMA of the pixel PXL and the first opening OPN1 of the bank BNK may correspond to each other. The above-described bank BNK may be omitted depending on an embodiment.

Each of the light emitting element LD may be an ultra-small light emitting diode using a material having an inorganic crystal structure, for example, having a size as small as a nano-scale or a micro-scale. Each of the light emitting elements LD may be an ultra-small light emitting diode manufactured by an etching method or an ultra-small light emitting diode manufactured by a growth method.

At least two to several tens of light emitting elements LD may be arranged or disposed and/or provided in the pixel area (PXA) (or light emitting area EMA) in which the pixel PXL may be provided or disposed, but the number of light emitting elements LD arranged or disposed and/or provided in the pixel area PXA is but is not limited thereto. In an embodiment, the number of light emitting elements LD arranged or disposed and/or provided in the pixel area PXA may be variously changed.

Each of the light emitting elements LD may emit one of color light and/or white light. In an embodiment, each of the light emitting elements LD may emit blue light in a short wavelength range, but the disclosure is not limited thereto.

Each of the light emitting elements LD may include a light emitting stacked pattern in which the first semiconductor layer 11, the active layer 12, the second semiconductor layer 13, and the additional electrode 15 may be sequentially stacked each other along the length L direction, and an insulating film 14 surrounding an outer circumferential surface of the light emitting stacked pattern. In an embodiment, the first semiconductor layer 11 may be an n-type semiconductor layer doped with an n-type dopant, the second semiconductor layer 13 may be a p-type semiconductor layer doped with a p-type dopant, and the additional electrode 15 may be an ohmic contact electrode ohmic-contacting the second semiconductor layer 13.

Each of the light-emitting elements LD may be arranged or disposed between the second electrode CE (or common electrode) and the pixel circuit layer PCL so that the length L direction of the corresponding light emitting element LD is parallel to the third direction DR3 (or perpendicular direction when viewed in a cross-sectional view).

In an embodiment, the first end portion EP1 and the second end portion EP2 of each of the light emitting elements LD may not be disposed on the same line (or plane), but may be disposed on different lines (or planes). Each of the light emitting elements LD may include the first end portion EP1 and the second end portion EP2 facing each other in the length L direction. When viewed in a cross-sectional view, the first end portion EP1 may be disposed at a lower end portion in the length L direction of the light emitting element LD, and the second end portion EP2 may be disposed at an upper end portion in the length L direction of the light emitting element LD. The first end portion EP1 may electrically contact the second electrode CE (or common electrode), and the second end portion EP2 may electrically contact some or a number of constituent elements of the pixel circuit layer PCL, for example, a first electrode PE (or pixel electrode).

The light emitting elements LD may be stably fixed by the intermediate layer CTL in the light emitting area EMA of the pixel PXL.

The intermediate layer CTL may be disposed between the second electrode CE (or common electrode) and the pixel circuit layer PCL, and may be provided or disposed to cover or overlap the light emitting elements LD. The intermediate layer CTL may be provided or disposed in the light emitting area EMA of the pixel PXL, and may be provided or disposed to fill between the second electrode CE (or common electrode) and the pixel circuit layer PCL. As an example, the intermediate layer CTL may be provided or disposed to fill the first opening OPN1 of the bank BNK as shown in FIG. 5 and FIG. 7. However, the disclosure is not limited thereto. In a case that the display element layer DPL does not include the bank BNK, as shown in FIG. 6, the intermediate layer CTL may be provided or disposed to entirely fill between the second electrode CE (or common electrode) and the pixel circuit layers PCL in the pixel area PXA of the pixel PXL.

After a fluid solution (or mixing solution) in which the light emitting elements LD are dispersed is supplied (or injected) into the light emitting area EMA of the pixel PXL, and the light emitting elements LD are arranged, the intermediate layer CTL may be cured to be formed and/or provided or disposed. The intermediate layer CTL may be provided or disposed to fill the first opening OPN1 of the bank BNK to be cured in the first opening OPN1 after the alignment of the light emitting elements LD is completed.

In an embodiment, the intermediate layer CTL may be made of an organic material. The organic material may include, for example, at least one of a photocurable resin including a photo polymerization initiator crosslinked and cured by light such as UV and a thermosetting polymer resin including a thermal polymerization initiator that initiates a curing reaction by heat. For example, the thermosetting resin may include an epoxy resin, an amino resin, a phenol resin, or a polyester resin made of an organic material. After the light emitting elements LD are aligned (or disposed) in the third direction DR3 (or vertical direction in a cross-sectional view) in the light emitting area EMA of the pixel PXL, the intermediate layer CTL may be cured by light such as UV or by heat. Accordingly, the intermediate layer CTL may stably fix the light emitting elements LD aligned in the third direction DR3 and prevent the light emitting elements LD from being separated from each other.

The intermediate layer CTL may have an appropriate thickness d1, for example, a thickness of about 10 μm in the third direction DR3, but the disclosure is not limited thereto. In an embodiment, the intermediate layer CTL may be designed to have a thickness thicker than the length L of each of the light emitting elements LD. In an embodiment, the intermediate layer CTL may include a groove HM exposing a portion of each of the light emitting elements LD to the outside. A thickness d2 of the intermediate layer CTL including the groove HM may be smaller (or thinner) than the length L of each of the light emitting elements LD.

The second semiconductor layer 13 and the additional electrode 15 may be disposed at one or an end portion of each of the light emitting elements LD exposed by the groove HM of the intermediate layer CTL, for example, at the second end portion EP2.

Figure 18:
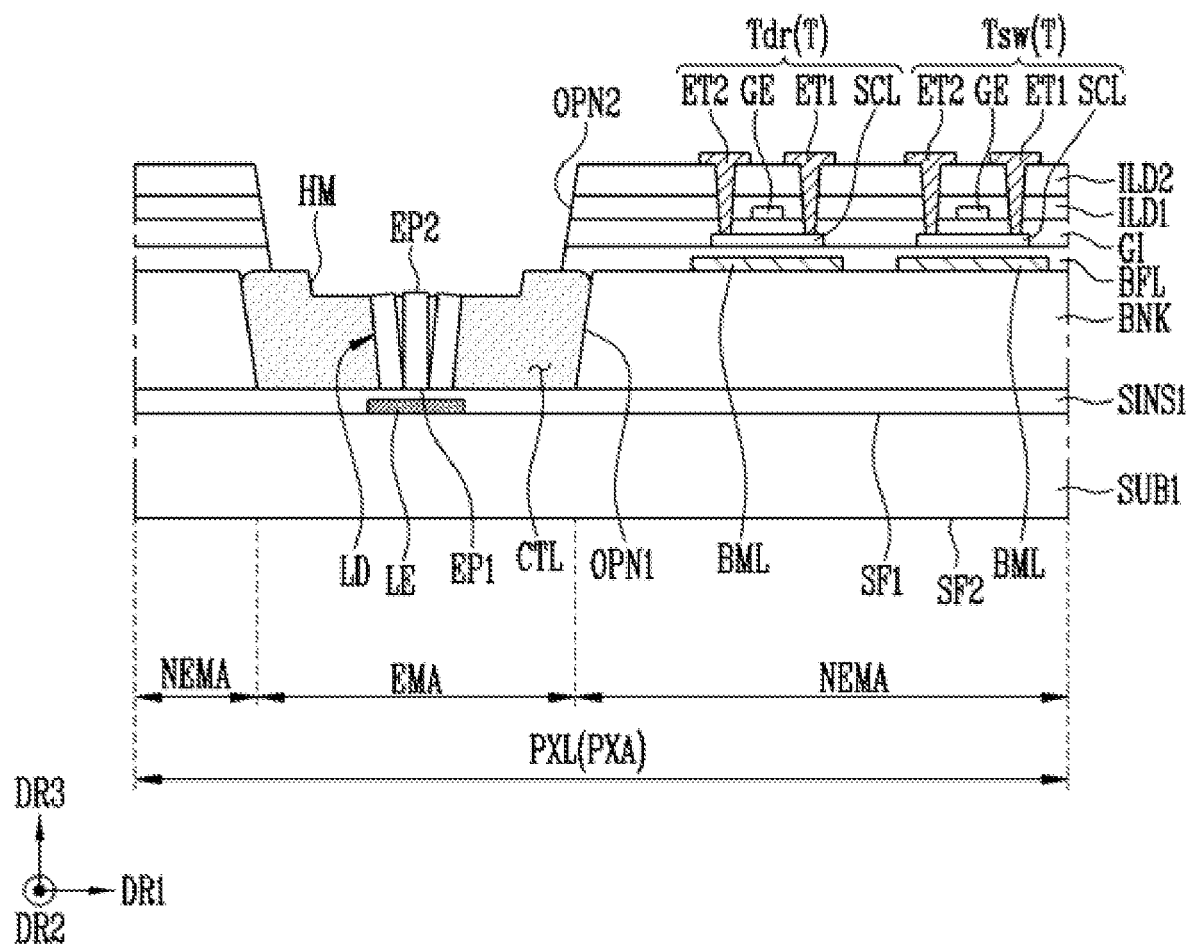
Figure 19:
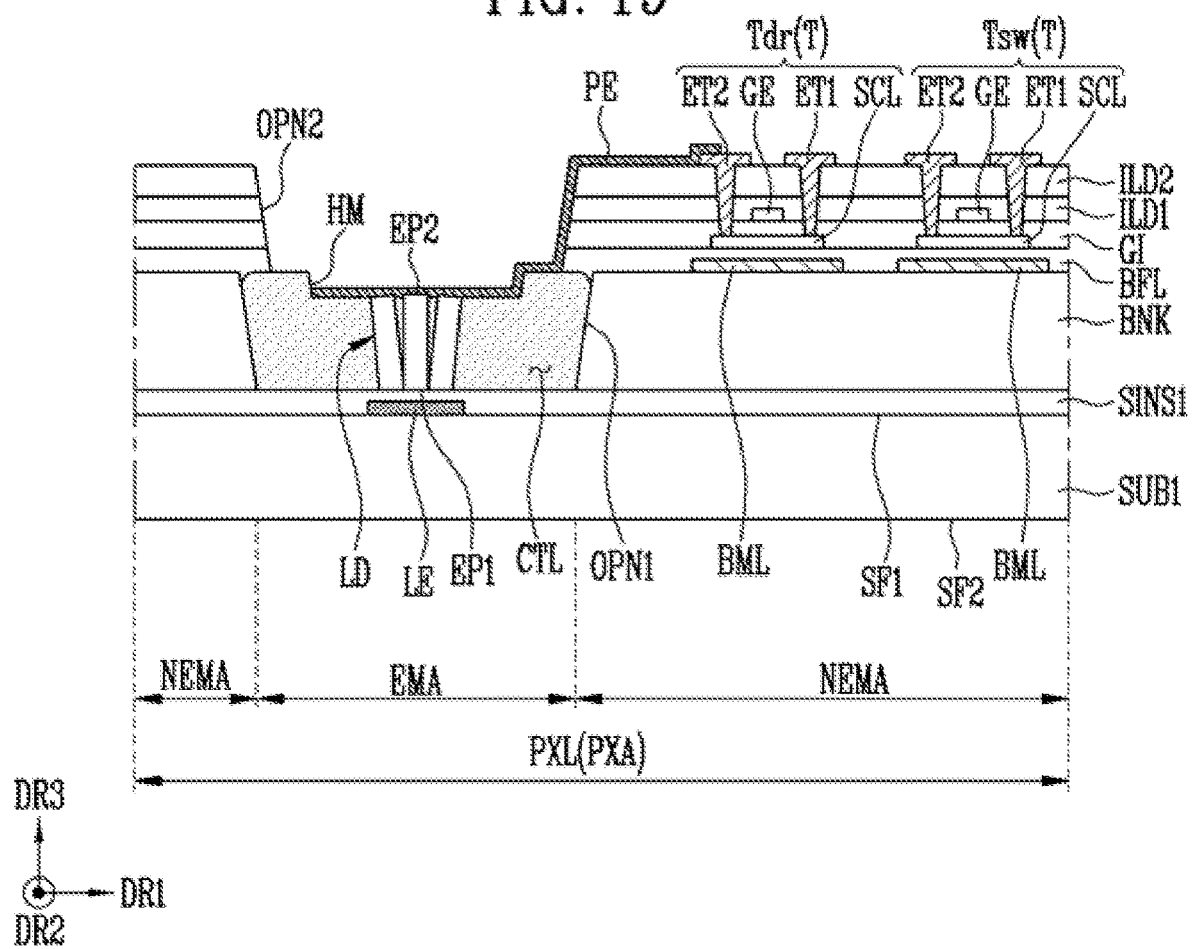
Figure 20:
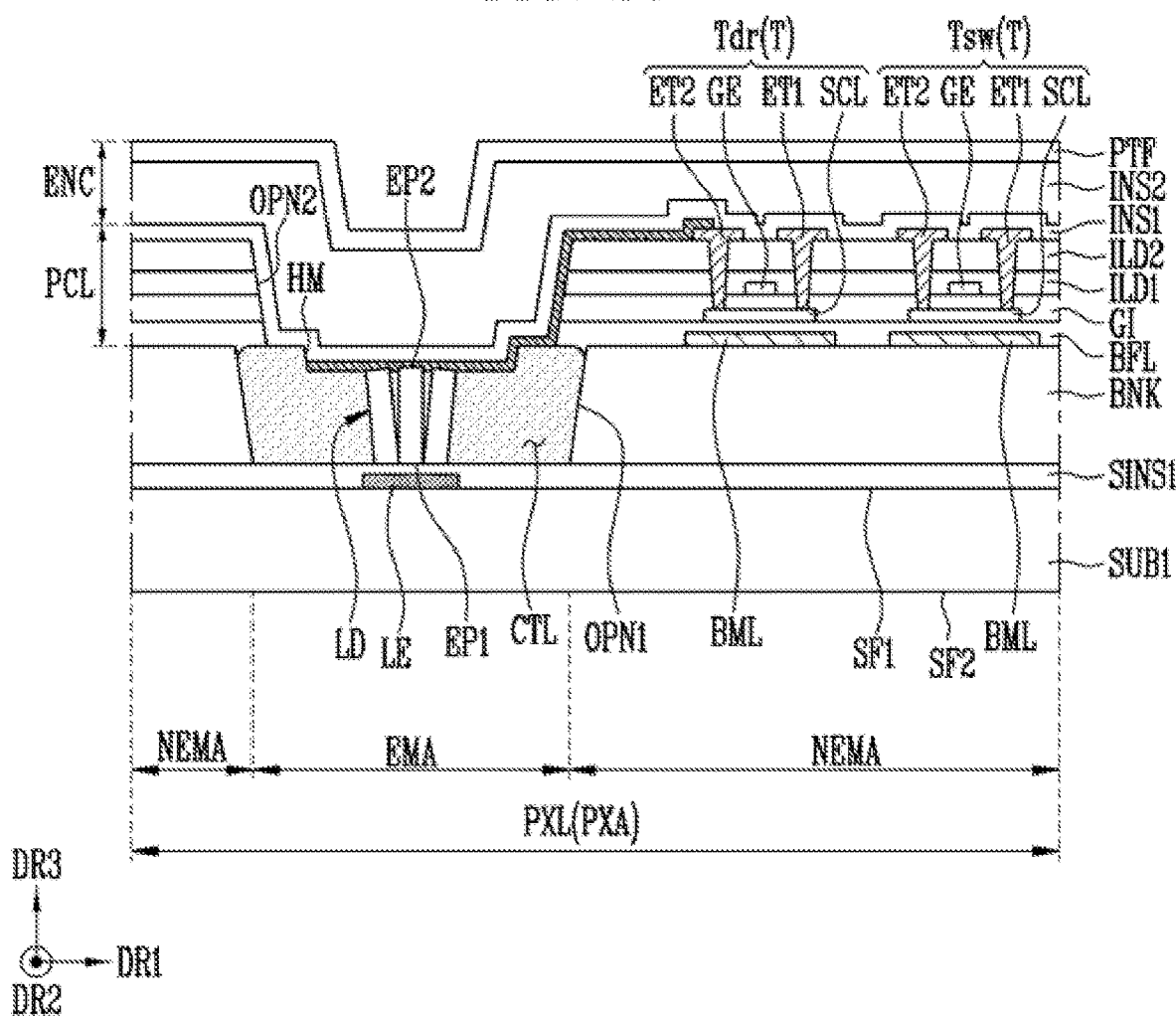

In an embodiment, as shown in FIG. 8B, the intermediate layer CTL may include an additional groove AHM exposing another portion of each of the light emitting elements LD to the outside. Another portion of each of the light emitting elements LD exposed by the additional groove ADM of the intermediate layer CTL may be the first end portion EP1 of the corresponding light emitting element LD. Here, the first semiconductor layer 11 may be disposed at the first end portion EP1. A thickness d3 of the intermediate layer CTL including the groove HM and the additional groove AHM may be further smaller (or thinner) than the length L of each of the light emitting elements LD. A detailed description of a method of forming the groove HM in the intermediate layer CTL will be described later with reference to FIG. 18, and a detailed description of a method of forming the additional groove AHM in the intermediate layer CTL will be described later with reference to FIG. 21 and FIG. 24.

The pixel circuit layer PCL may be provided or disposed and/or formed on the bank BNK and the intermediate layer CTL.

The pixel circuit layer PCL may include a buffer layer BFL, at least one transistor T, a first electrode PE (or pixel electrode), and a first insulating layer INS1.

The buffer layer BFL may prevent impurities from being diffused into the transistor T included in the pixel circuit PXC. The buffer layer BFL may be an inorganic insulating film including an inorganic material. The buffer layer BFL may include at least one of metal oxides such as a silicon nitride ($SiN_x$), a silicon oxide ($SiO_x$), a silicon oxynitride ($SiO_xN_y$), and an aluminum oxide ($AlO_x$). The buffer layer BFL may be provided as a single film, but may be provided as a multifilm of at least two or more films. In a case that the buffer layer BFL is provided as the multi-film, respective layers thereof may be made of the same or similar material or different materials. The buffer layer BFL may be omitted according to embodiments.

The transistor T may include a driving transistor Tdr for controlling a driving current of the light emitting elements LD and a switching transistor Tsw electrically connected to the driving transistor Tdr. However, the disclosure is not limited thereto, and the pixel circuit PXC may further include circuit elements that perform other functions in addition to the driving transistor Tdr and the switching transistor Tsw. The driving transistor Tdr may be the first transistor T1 described with reference to FIG. 4, and the switching transistor Tsw may be the second transistor T2 described with reference to FIG. 4. In the following embodiment, the driving transistor Tdr and the switching transistor Tsw may be comprehensively referred to as a transistor T or transistors T.

Each of the driving transistor Tdr and the switching transistor Tsw may include a semiconductor pattern SCL, a gate electrode GE, a first terminal ET1, and a second terminal ET2. The first terminal ET1 may be one of a source electrode and a drain electrode, and the second terminal ET2 may be the remaining electrode. For example, in a case that the first terminal ET1 is the source electrode, the second terminal ET2 may be the drain electrode.

The semiconductor pattern SCL may be provided or disposed and/or formed on the buffer layer BFL. The semiconductor pattern SCL may include a first contact region in electrical contact with the first terminal ET1 and a second contact region in electrical contact with the second terminal ET2. A region between the first contact region and the second contact region may be a channel region. The channel region may overlap the gate electrode GE of the corresponding transistor T. The semiconductor pattern SCL may be a semiconductor pattern made of a poly silicon, an amorphous silicon, an oxide semiconductor, or the like within the spirit and the scope of the disclosure. For example, the channel region, which is a semiconductor pattern that may not be doped with impurities, may be an intrinsic semiconductor. The first contact region and the second contact region may be semiconductor patterns doped with impurities.

The gate electrode GE may be provided or disposed and/or formed on a gate insulating layer GI to correspond to the channel region of the semiconductor pattern SCL. The gate electrode GE may be provided or disposed on the gate insulating layer GI to overlap the channel region of the semiconductor pattern SCL. The gate electrode GE may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material.

The gate insulating layer GI may be an inorganic insulating film including an inorganic material. For example, the gate insulating layer GI may include at least one of metal oxides such as a silicon nitride ($SiN_x$), a silicon oxide ($SiO_x$), a silicon oxynitride ($SiO_xN_y$), and an aluminum oxide ($AlO_x$). However, the material of the gate insulating layer GI is not limited to the above-described embodiments. In an embodiment, the gate insulating layer GI may be formed as an organic insulating film including an organic material. The gate insulating layer GI may be provided as a single film, and may be provided as a multi-film of at least two or more films.

Each of the first terminal ET1 and the second terminal ET2 may be provided or disposed and/or formed on a second interlayer insulating layer ILD2, and may electrically contact the first contact region and the second contact region of the semiconductor pattern SCL through a contact hole sequentially passing through the gate insulating layer GI and the first and second interlayer insulating layers ILD1 and ILD2. For example, the first terminal ET1 may electrically contact the first contact region of the semiconductor pattern SCL, and the second terminal ET2 may electrically contact the second contact region of the semiconductor pattern SCL. Each of the first and second terminals ET1 and ET2 may include the same or similar material as that of the gate electrode GE, or may include one or more materials selected from the materials illustrated as constituent materials of the gate electrode GE.

A first interlayer insulating layer ILD1 may include the same or similar material as that of the gate insulating layer GI, or may include one or more materials selected from the materials illustrated as constituent materials of the gate insulating layer GI.

A second interlayer insulating layer ILD2 may be provided or disposed and/or formed on the first interlayer insulating layer ILD1. The second interlayer insulating layer INS2 may be an inorganic insulating film including an inorganic material or an organic insulating film including an organic material. In an embodiment, the second interlayer insulating layer ILD2 may include the same or similar material as the first interlayer insulating layer ILD1, but the disclosure is not limited thereto. The second interlayer insulating layer ILD2 may be provided as a single film, and may be provided as a multi-film of at least two or more layers.

In the above-described embodiment, it is described that the first and second terminals ET1 and ET2 of the transistor T are separate electrodes that are electrically connected to the semiconductor pattern SCL through the contact hole sequentially penetrating the gate insulating layer GI and the first and second interlayer insulating layer ILD1 and ILD2, but the disclosure is not limited thereto. In an embodiment, the first terminal ET1 of the transistor T may be a first contact region adjacent to the channel region of the corresponding semiconductor pattern SCL, and the second terminal ET2 of the transistor T may be a second contact region adjacent to the channel region of the corresponding semiconductor pattern SCL. The second terminal ET2 of the transistor T may be electrically connected to the light emitting elements LD of the corresponding pixel PXL through a separate connection member such as a bridge electrode.

In an embodiment, the transistors T may be a low temperature polysilicon thin film transistor, but the disclosure is not limited thereto. In an embodiment, the transistors T may be configured as an oxide semiconductor thin film transistor. For example, in the above-described embodiment, the case in which the transistors T are thin film transistors having a top gate structure is described as an example, but the disclosure is not limited thereto, and the structure of the transistors T may be variously changed.

The pixel circuit layer PCL may include a second opening OPN2. The second opening OPN2 may be formed by removing a portion of the insulating layers corresponding to the light emitting area EMA of the pixel PXL. For example, the second opening OPN2 may be formed by removing the buffer layer BFL, the gate insulating layer GI, and the first and second interlayer insulating layers ILD1 and ILD2 in the light emitting area EMA. In an embodiment, the second opening OPN2 may correspond to or coincide with the first opening OPN1. Accordingly, the intermediate layer CTL provided or disposed to fill the first opening OPN1 may be exposed to the outside. The second end portion EP2 of each of the light emitting elements LD exposed by the groove HM of the intermediate layer CTL may be exposed.

The first electrode PE (or pixel electrode) may be provided or disposed and/or formed in the second opening OPN2 to electrically contact the second end portion EP2 of each of the exposed light emitting elements LD. The first electrode PE (or pixel electrode) may be provided or disposed in the second opening OPN2 to electrically contact at least a portion of the intermediate layer CTL and the second end portion EP2 of each of the exposed light emitting elements LD. For example, the first electrode PE (or pixel electrode) may electrically contact the second terminal ET2 of the driving transistor Tdr. In an embodiment, the first electrode PE (or pixel electrode) may be an anode. The first electrode PE (or pixel electrode) may have the same configuration or structure as the first electrode EL1 described with reference to FIG. 4.

The first electrode PE (or pixel electrode) may be made of various transparent conductive materials (or substances) in order to proceed light that may be emitted from each of the light emitting elements LD and reflected in a target direction by the second electrode CE (or common electrode) to the image display direction of the display device without loss. For example, the first electrode PE (or pixel electrode) may at least one of various transparent conductive materials (or substances) such as an indium tin oxide (ITO), an indium zinc oxide (IZO), a zinc oxide (ZnO), an indium gallium zinc oxide (IGZO), and an indium tin zinc oxide (ITZO), and may be formed to be substantially transparent or translucent to satisfy a predetermined light transmittance (or transmittance). However, the material of the first electrode PE (or pixel electrode) is not limited to the above-described embodiment.

The first insulating layer INS1 may be an inorganic insulating film including an inorganic material or an organic insulating film including an organic material. For example, the first insulating layer INS1 may have a structure in which at least one inorganic insulating film and at least one organic insulating film may be alternately stacked each other. The first insulating layer INS1 may entirely cover or overlap the pixel circuit layer PCL including the first electrode PE (or pixel electrode).

For example, the pixel circuit layer PCL may further include a bottom layer BML.

The bottom layer BML may be used as a light blocking member that blocks light emitted from the light emitting elements LD from proceeding to the transistors T. The bottom layer BML may be made of a conductive material (or substance) having a constant reflectance. The conductive material (or substance) may include an opaque metal. However, the material of the bottom layer BML is not limited to the above-described embodiments. In an embodiment, the bottom layer BML may be made of a material that blocks or absorbs light. For example, the bottom layer BML may be a black matrix.

In an embodiment, the pixel circuit layer PCL may further include a conductive pattern CP as shown in FIG. 7.

The conductive pattern CP may be provided or disposed in the second opening OPN2, and may be provided or disposed and/or formed on a portion of the first electrode PE (or pixel electrode). For example, the conductive pattern CP may be provided or disposed only on the first electrode PE (or pixel electrode) disposed on an inclined surface of the second opening OPN2 to not overlap the light emitting elements LD (or the light emitting area EMA of the pixel PXL). The conductive pattern CP may be used as a reflective member that guides light emitted from the second end portion EP2 of each of the light emitting elements LD in the image display direction. For this purpose, the conductive pattern CP may be made of a conductive material (or substance) having a constant reflectance. The conductive pattern CP may be made of a conductive material (or substance) having a constant reflectance. The conductive material (or substance) may include an opaque metal. For example, the conductive pattern CP may include the same or similar material as the second electrode CE (or common electrode), or may include one or more selected from the materials exemplified as the constituent materials of the second electrode CE (or common electrode).

The encapsulation layer ENC may be provided or disposed and/or formed on the pixel circuit layer PCL. In an embodiment, the encapsulation layer ENC may include a second insulating layer INS2 and a protective film PTF.

The second insulating layer INS2 may be provided or disposed and/or formed on the first insulating layer INS1. The second insulating layer INS2 may be provided to include an organic insulating film, an inorganic insulating film, or the organic insulating layer disposed on the inorganic insulating film. The inorganic insulating film may include, for example, at least one of metal oxides such as a silicon nitride ($SiN_x$), a silicon oxide ($SiO_x$), a silicon oxynitride ($SiO_xN_y$), and an aluminum oxide ($AlO_x$). The organic insulating film may be, for example, at least one of a polyacrylates resin, an epoxy resin, a phenolic resin, a polyamides resin, a polyimides rein, an unsaturated polyesters resin, a poly-phenylene ethers resin, a poly-phenylene sulfides resin, and a benzocyclobutene resin. The second insulating layer INS2 may be made of a transparent insulating material to minimize loss of light proceeding in the image display direction of the display device.

In an embodiment, the second insulating layer INS2 may be designed to have a thickness of a predetermined level or more, so that it is possible to alleviate a step due to constituent elements disposed at a lower portion thereof. For this purpose, the second insulating layer INS2 may be provided as an organic insulating film containing an organic material. For example, the second insulating layer INS2 may be used as a reinforcing element to improve mechanical strength of the pixel circuit layer PCL in the process of forming the second electrode (CE) (or common electrode) of the display element layer DPL.

The protective film PTF may be entirely provided or disposed on the second insulating layer INS2 to prevent impurity penetration and to serve as a buffer from external impact. The protective film PTF is disposed at an uppermost portion of the display device, while it may be disposed at a lowermost portion of the display device in a case that the intermediate layer CTL is upwardly directed and the pixel circuit layer PCL is downwardly directed. In other words, the protective film PTF may be attached on constituent elements included in the pixel circuit layer PCL during the manufacturing process of the second electrode CE (or common electrode) to protect the constituent elements, and after a series of processes are completed, the protective film PTF may be removed from the protective film PTF. Such a protective film PTF may be made of, for example, a resin including PET with adhesive (or bonding property), but the disclosure is not limited thereto.

In an above embodiment, the first semiconductor layer 11 electrically connected to the second electrode CE (or common electrode) by contacting (or, directly contacting) the second electrode CE (or common electrode) in each of the light emitting elements LD may be disposed at the lower end portion thereof in the length L direction of the corresponding light emitting element LD, and the second semiconductor layer 13 electrically connected to the first electrode PE (or pixel electrode) by contacting (or, directly contacting) the first electrode PE (or pixel electrode) may be disposed at the upper end portion thereof in the length L direction of the corresponding light emitting element LD.

In a case that a driving current flows from the first power line (see 'PL1' in FIG. 4) through the pixel circuit PXC to the second power line (see 'PL2' in FIG. 4), the driving current may flow into the first electrode PE (or the pixel electrode) through the driving transistor Tdr of the pixel circuit layer PCL. The driving current flows in the second electrode (CE) (or common electrode) through each of the light emitting elements LD that may be in direct electrical contact with (or electrically connected to) the first electrode PE (or pixel electrode). Accordingly, each of the light emitting elements LD may emit light with luminance corresponding to a distributed current. As described above, the first electrode PE (or pixel electrode) may be defined as an anode that electrically connects the driving transistor Tdr and the light emitting elements LD, and the second electrode CE (or common electrode) may be defined as a cathode that electrically connects the second power line PL2 and the light emitting elements LD.

According to the above-described embodiment, as the first end portion EP1 of each of the light emitting elements LD is disposed at the lower end portion in the length L direction, and the second end portion EP2 of the corresponding light emitting element LD is disposed at the upper end portion in the length L direction, each of the light emitting elements LD may be aligned in the third direction DR3, for example, in a vertical direction in a cross-sectional view. Accordingly, each of the light emitting elements LD may emit light in the entire area in which the active layer 12 is disposed. For example, the light emitted from the active layer 12 of each light emitting element LD and directed to the first end portion EP1 of the corresponding light emitting element LD may be reflected by the second electrode CE (or common electrode) to proceed to a target direction (or image display direction of the display device). For example, the light emitted from the active layer 12 of each light emitting element LD and directed to the second end portion EP2 of the corresponding light emitting element LD may pass through the first electrode PE (or pixel electrode) as it is to proceed to a target direction (or image display direction of the display device). Therefore, an amount (or intensity) of the light emitted from each of the light emitting elements LD and proceeding in the image display direction of the display device may be increased, so that the emission efficiency of the pixel PXL may be improved.

For example, according to the above-described embodiment, since other constituent elements other than the intermediate layer CTL and the light emitting elements LD are not provided or disposed between the first electrode PE (or the pixel electrode) and the second electrode CE (or the common electrode), the light emitted from the light-emitting elements LD may not be scattered by the other constituent elements and may proceed in the image display direction of the display device. Thus, the amount (or intensity) of the light proceeding in the image display direction of the display device may further increase, so that the emission efficiency of the pixel PXL may be further improved.

Additionally, according to the above-described embodiment, as the light emitting elements LD are aligned in the vertical direction between the first electrode PE (or pixel electrode) and the second electrode CE (or common electrode), the area occupied by the light emitting elements LD in the pixel area PXA (or light emitting area EMA) of the pixel PXL is reduced, so that the alignment area of the light emitting elements LD may be further secured.

For example, according to the above-described embodiment, since the support member, for example, a reflective partition wall, for guiding the light emitted from the light emitting elements LD in a target direction may be omitted, the spatial efficiency of the pixel area PXA may be improved. Therefore, since spatial constraint between the constituent elements included in the pixel PXL, for example, a critical dimension (CD) (a line width of each of the electrodes, or a width of the gap between the electrodes') constraint between the electrodes included in the pixel PXL are reduced, a high resolution and high definition display device may be easily implemented.

In the above-described embodiment, each pixel PXL has been described as emitting light toward the upper portion of the pixel circuit layer PCL, but the disclosure is not limited thereto. In an embodiment, each pixel PXL may emit light toward the rear surface of the third insulating layer INS3. The second electrode CE (or common electrode) may be made of a transparent conductive material, and the first electrode PE (or pixel electrode) may be made of an opaque metal having a constant reflectance. Accordingly, the light emitted from the first end portion EP1 of each of the light emitting elements LD may pass through the third insulating layer INS3 as it is, and the light emitted from the second end portion EP2 of the light emitting element LD may be reflected in a target direction (the direction of the rear surface of the third insulating layer INS3) by the first electrode PE (or pixel electrode). As a result, each pixel PXL may emit light toward the rear surface of the third insulating layer INS3. Here, the first electrode PE (or pixel electrode) may be a light guide member (or reflective member) that guides the light emitted from the light emitting elements LD in the direction of the rear surface of the third insulating layer INS3.

Figure 21:
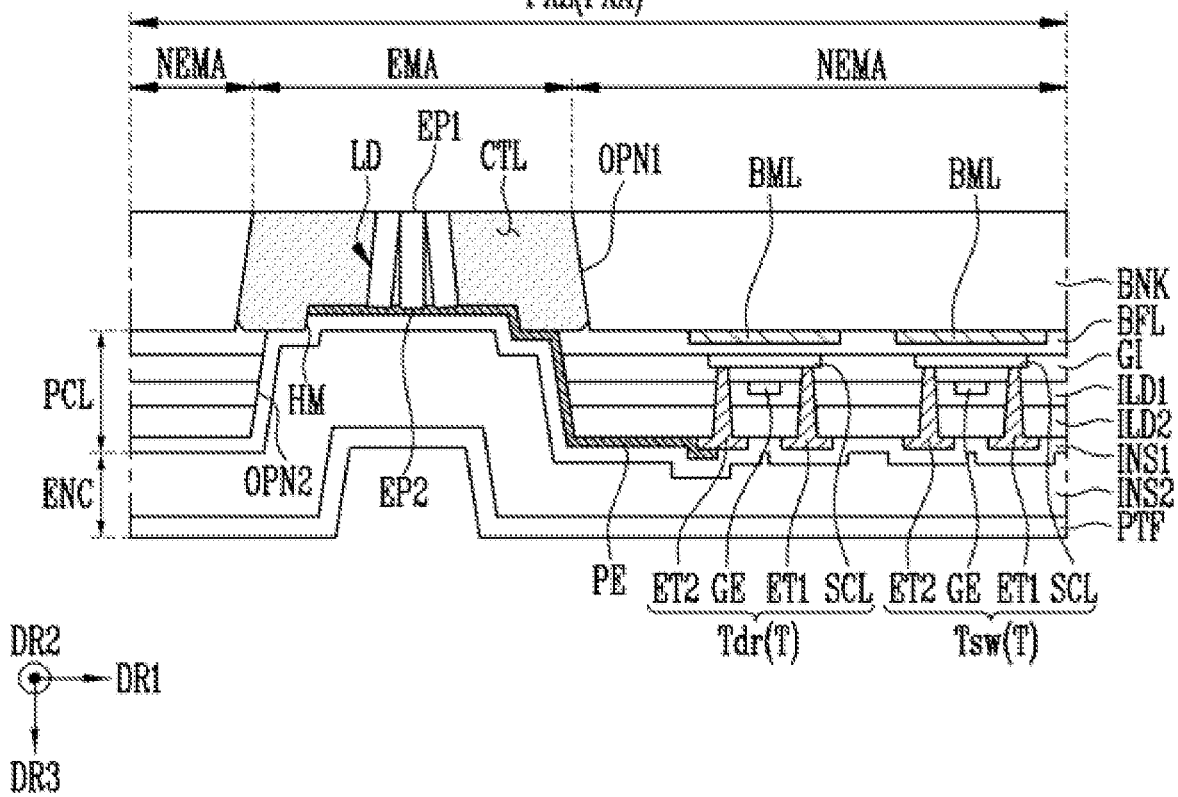
Figure 22:
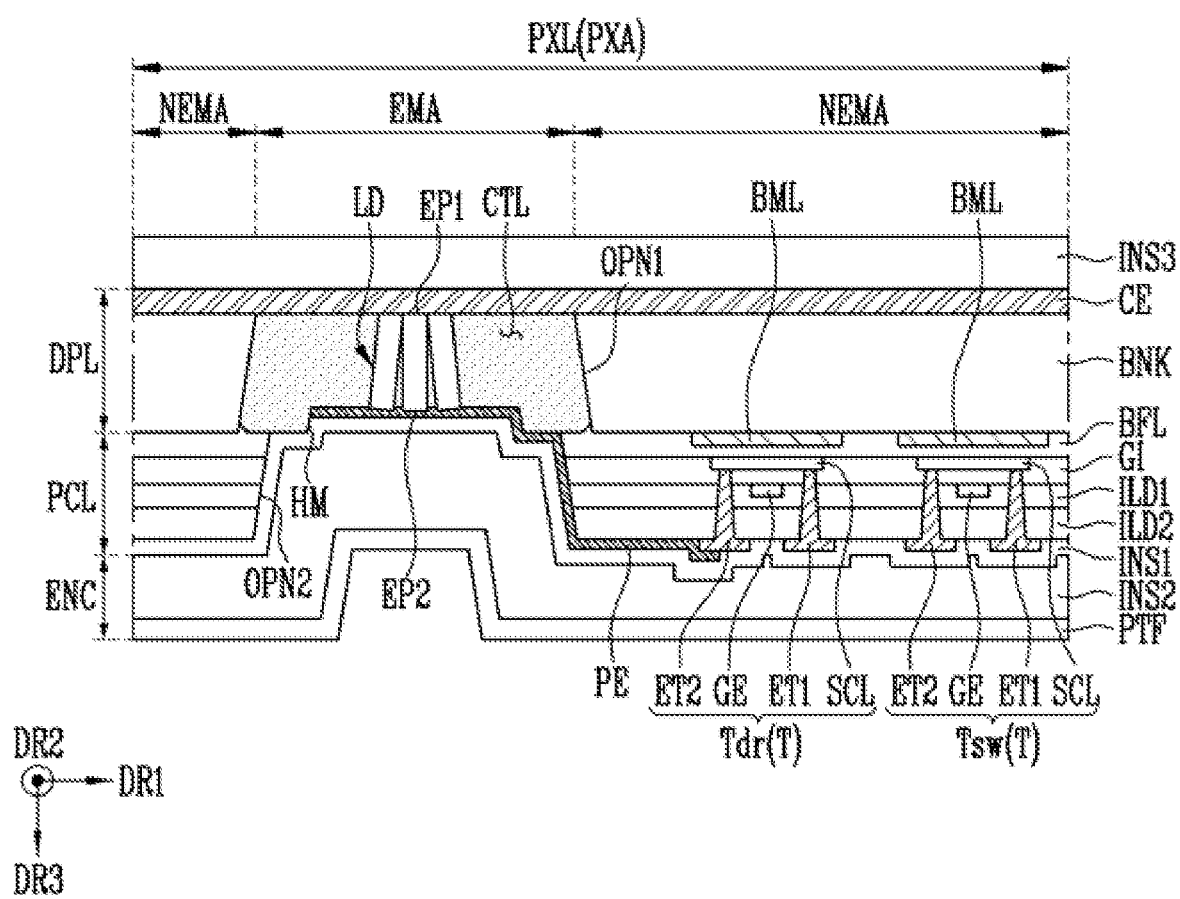
Figure 23:
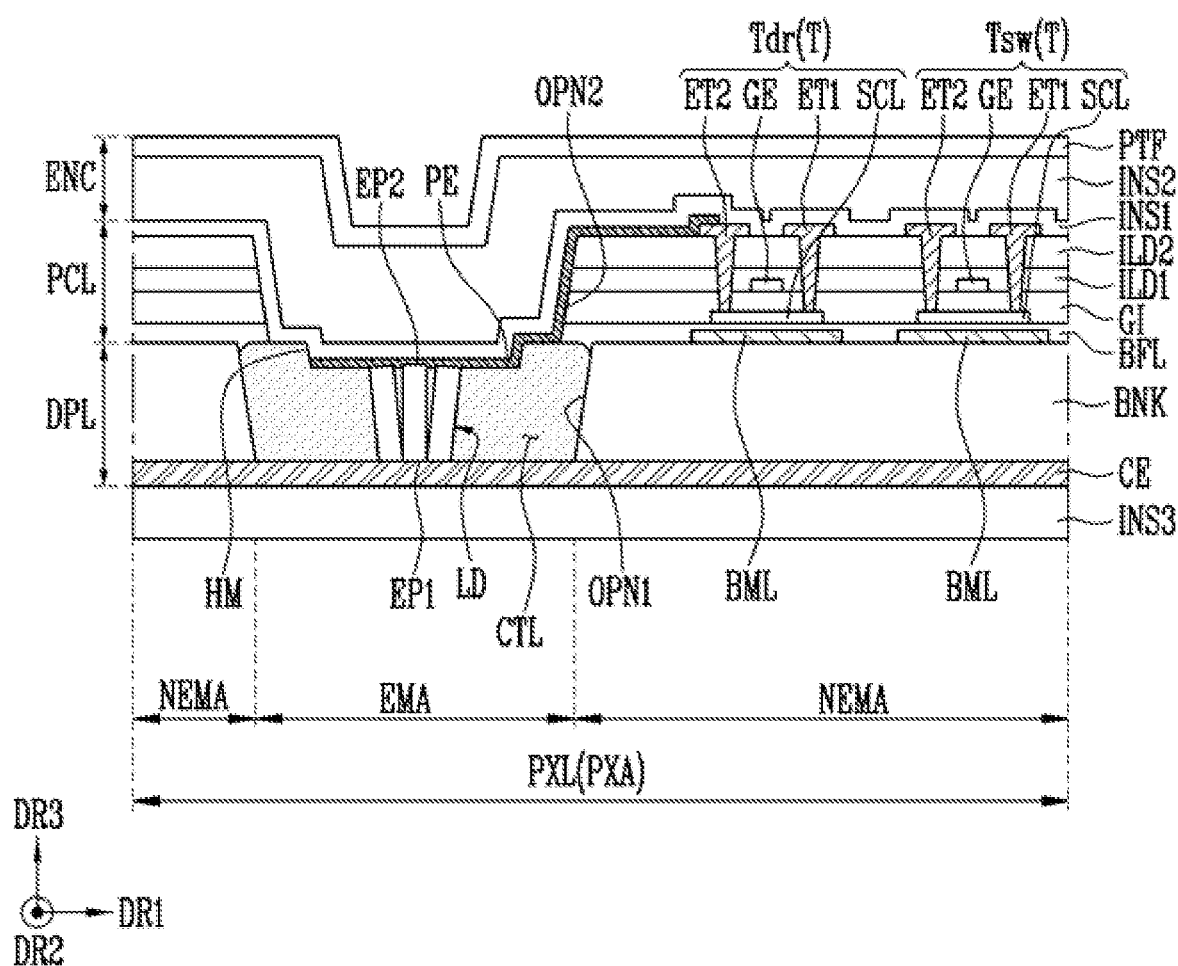
Figure 24:
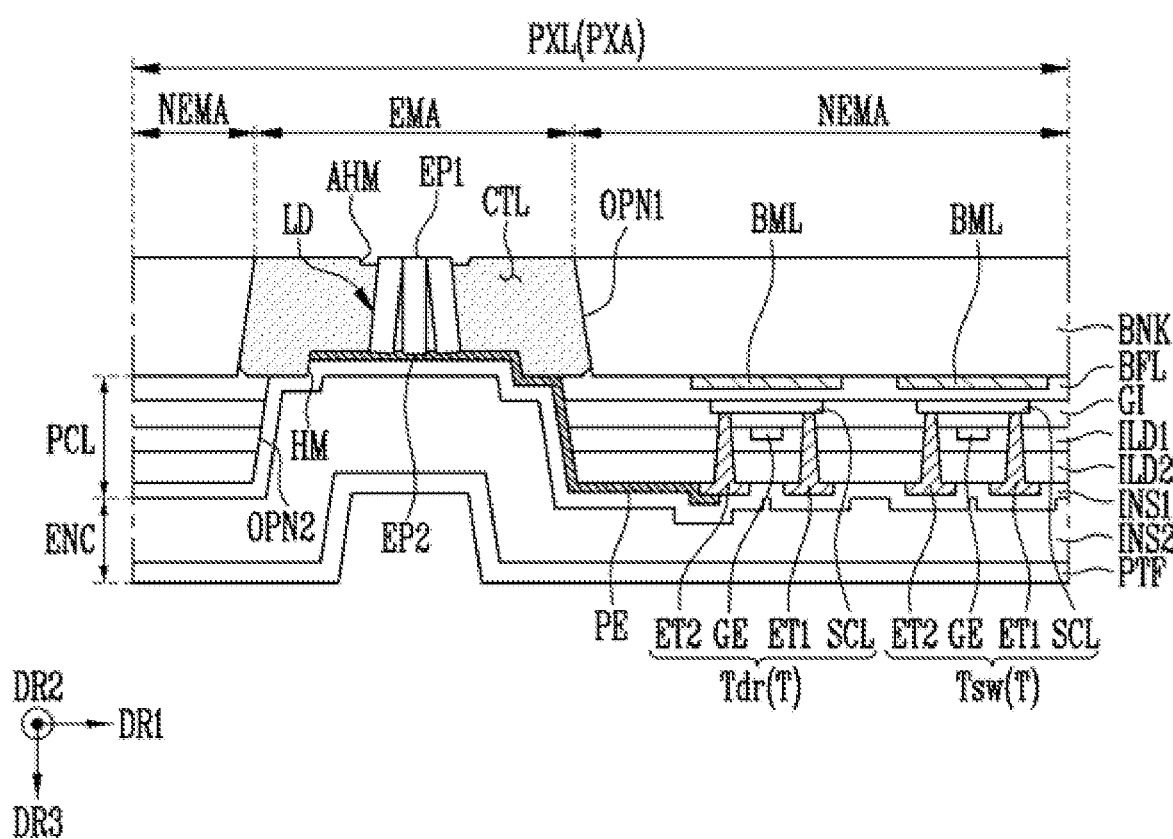
FIG. 24 illustrates a schematic cross-sectional view of an embodiment of the manufacturing method of FIG. 21.

FIG. 9 to FIG. 23 illustrate sequential schematic cross-sectional views of a manufacturing method of the pixel of FIG. 5, and FIG. 24 illustrates a schematic cross-sectional view of an embodiment of the manufacturing method of FIG. 21.

Hereinafter, a manufacturing method of the pixel according to an embodiment shown in FIG. 5 will be sequentially described with reference to FIG. 9 to FIG. 24.

Figure 9:
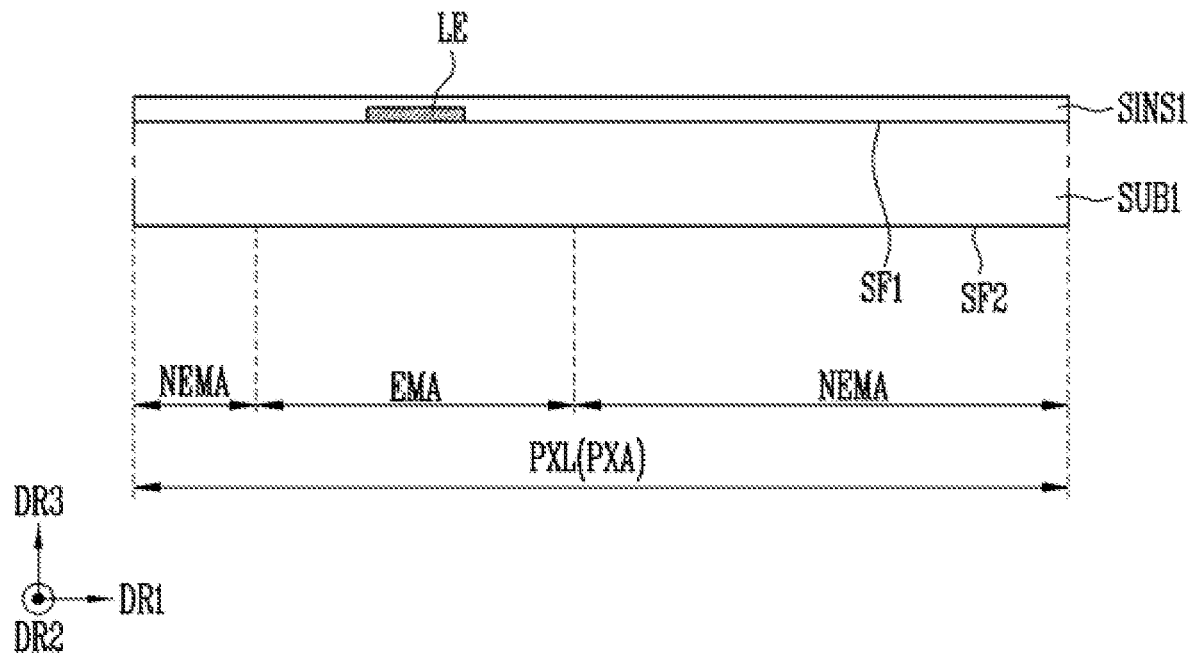
FIG. 9 to FIG. 23 illustrate sequential schematic cross-sectional views of a manufacturing method of the pixel of FIG. 5.

Referring to FIG. 5 and FIG. 9, a first substrate SUB1 in which a lower electrode LE may be locally disposed on a first surface SF1 thereof is prepared. A first sub-insulating layer SINS1 covering or overlapping the lower electrode LE may be formed.

The first substrate SUB1 may be a rigid substrate or flexible substrate including an insulating material. For example, the rigid substrate may be one of a glass substrate, a quartz substrate, a glass ceramic substrate, and a crystalline glass substrate. The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In an embodiment, the first substrate SUB1 may be a support substrate supporting the lower electrode LE and the light emitting elements LD during a series of processes, and may be configured as a rigid substrate such as glass.

In an embodiment, the lower electrode LE may be a first alignment electrode for aligning the light emitting elements LD in the pixel PXL. The lower electrode LE may include a conductive material (or substance). As an example, the lower electrode LE may include the same or similar material as the gate electrode GE described with reference to FIG. 5 to FIG. 8B, or may include one or more selected from the materials exemplified as the constituent material of the gate electrode GE.

The first sub-insulating layer SINS1 may be an inorganic insulating film including an inorganic material. In an embodiment, the first sub-insulating layer SINS1 may include a material that may be easily peeled off in a substrate separation process using a laser.

Figure 10:
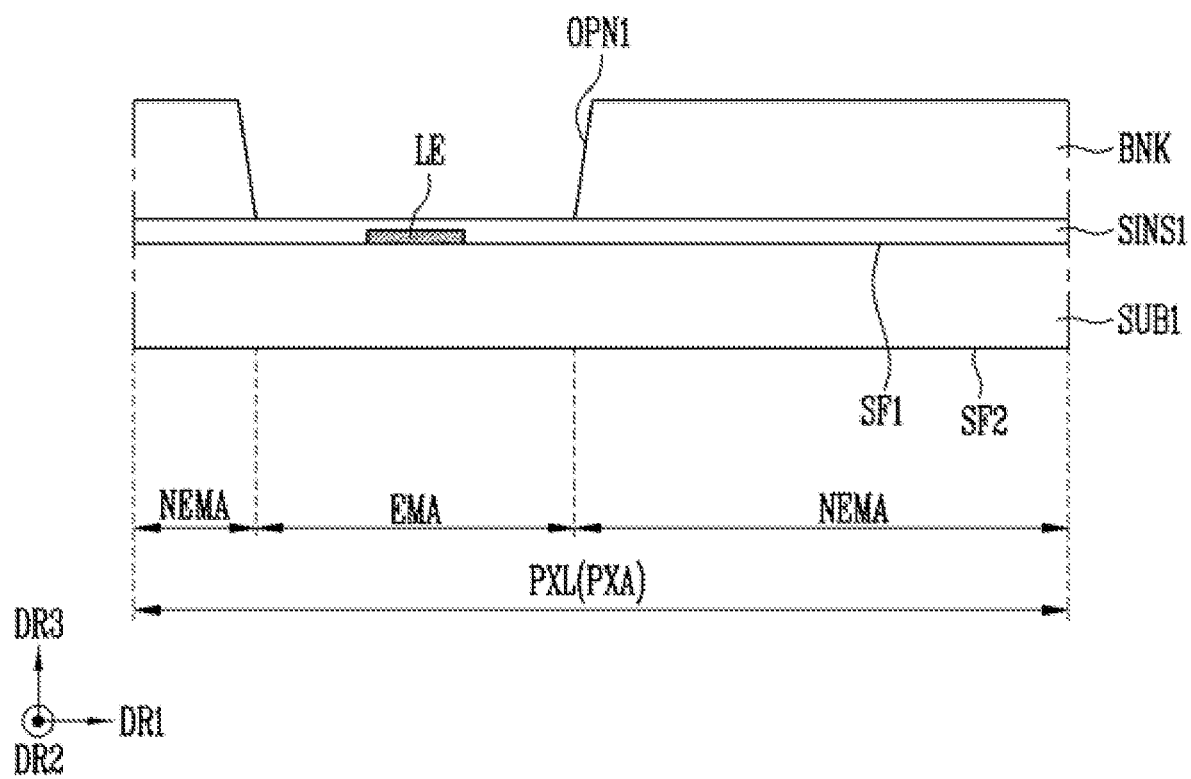
Figure 11:
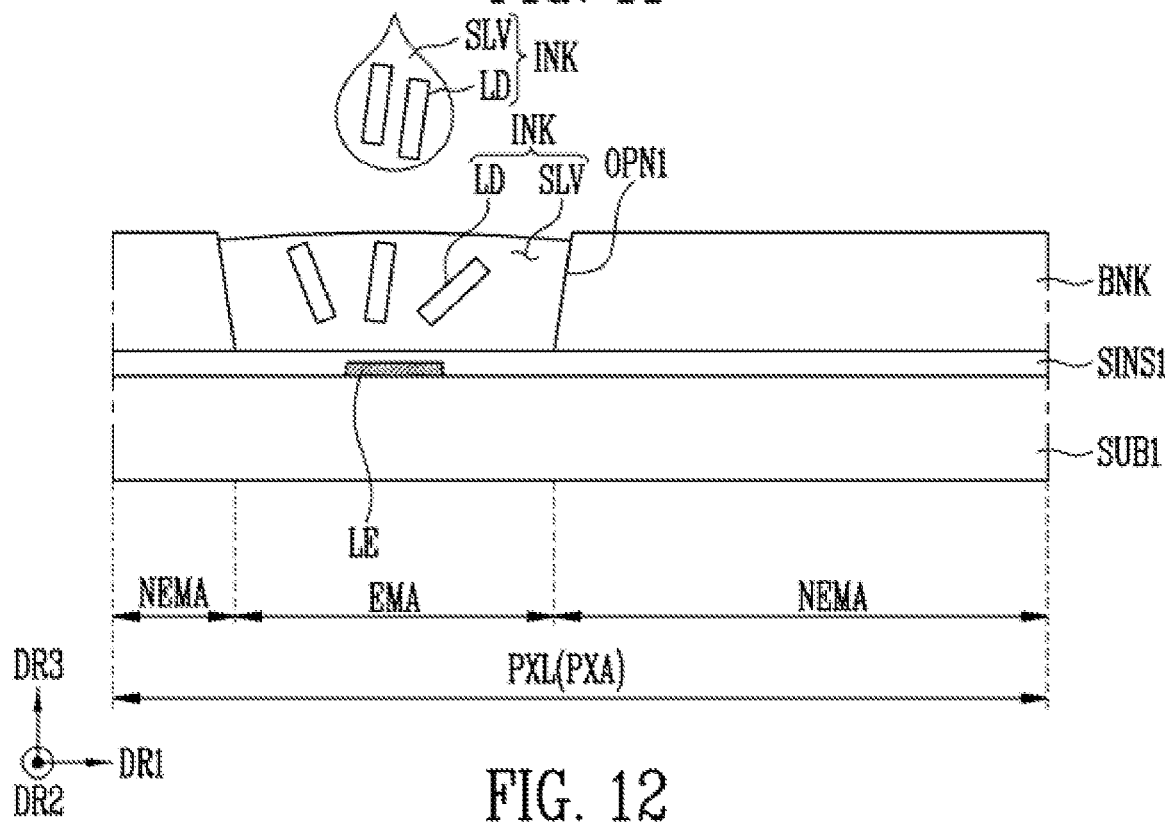
Figure 12:
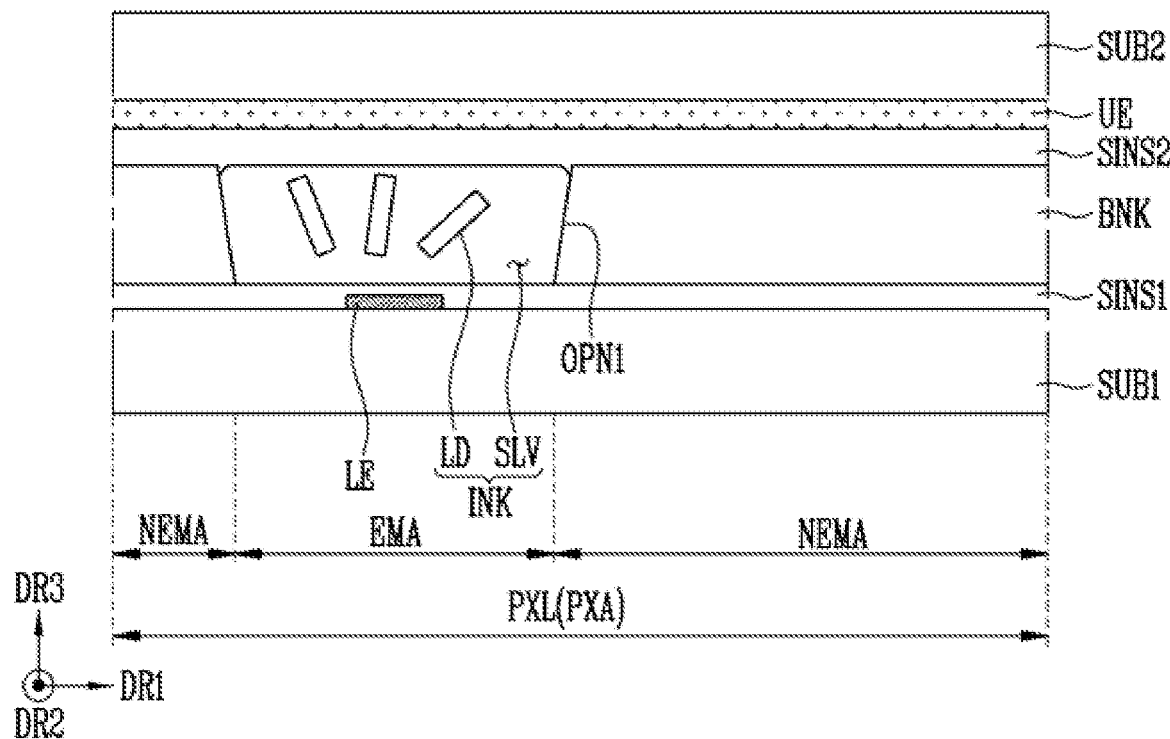
Figure 13:
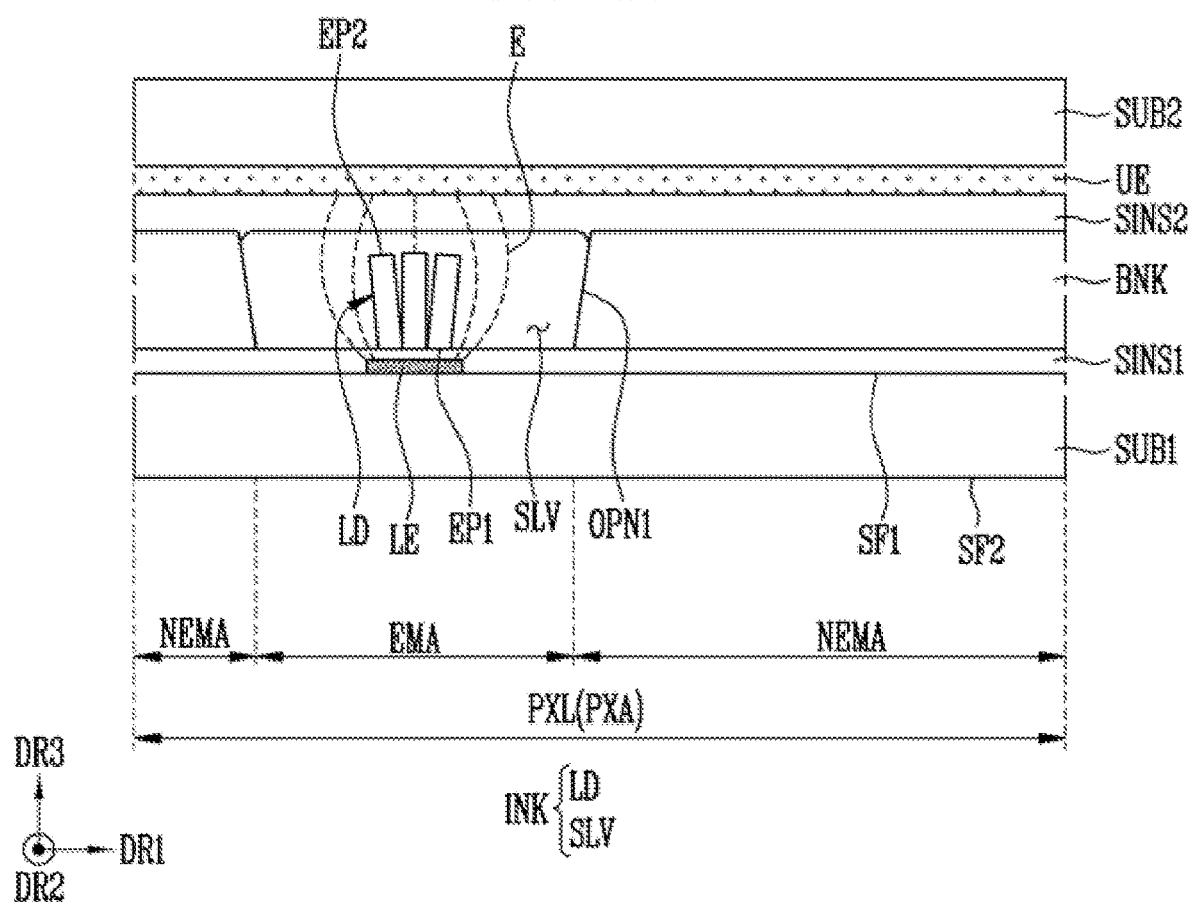
Figure 14:
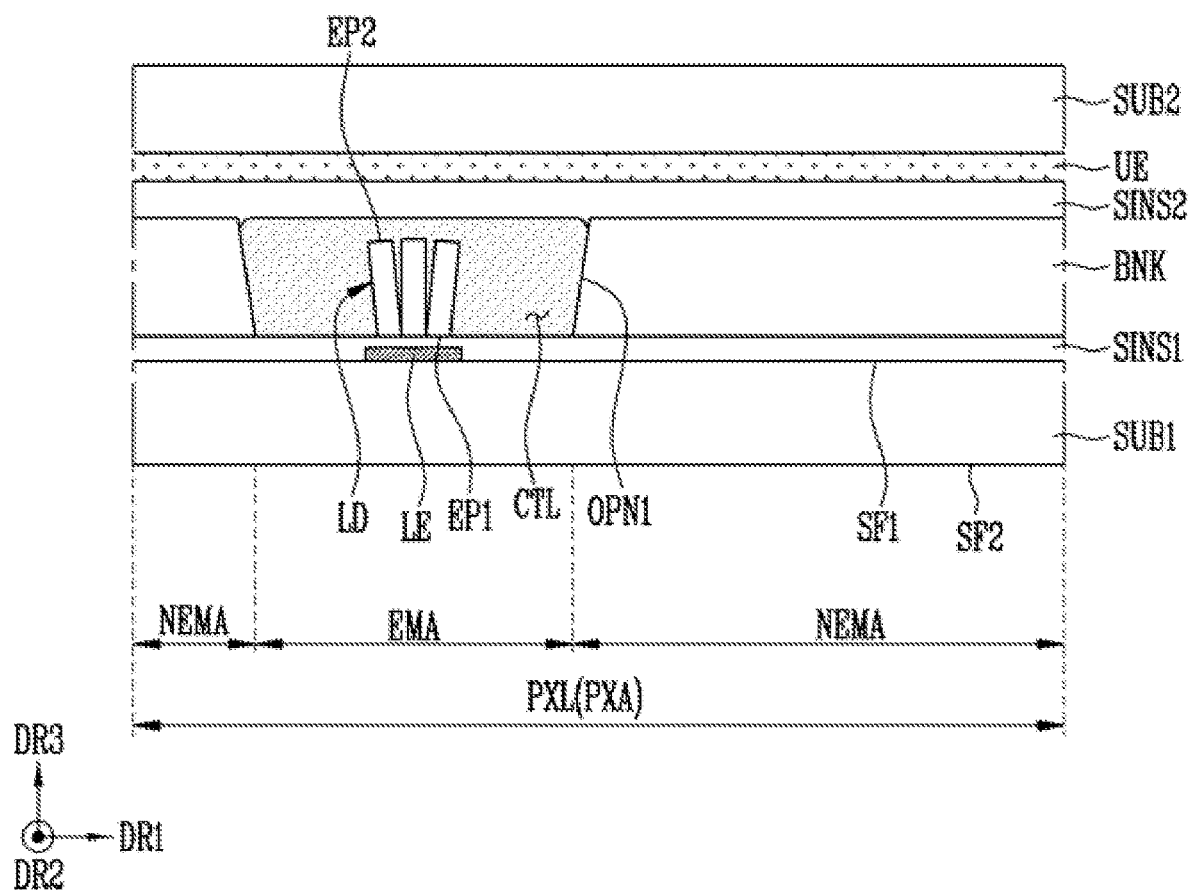
Figure 15:
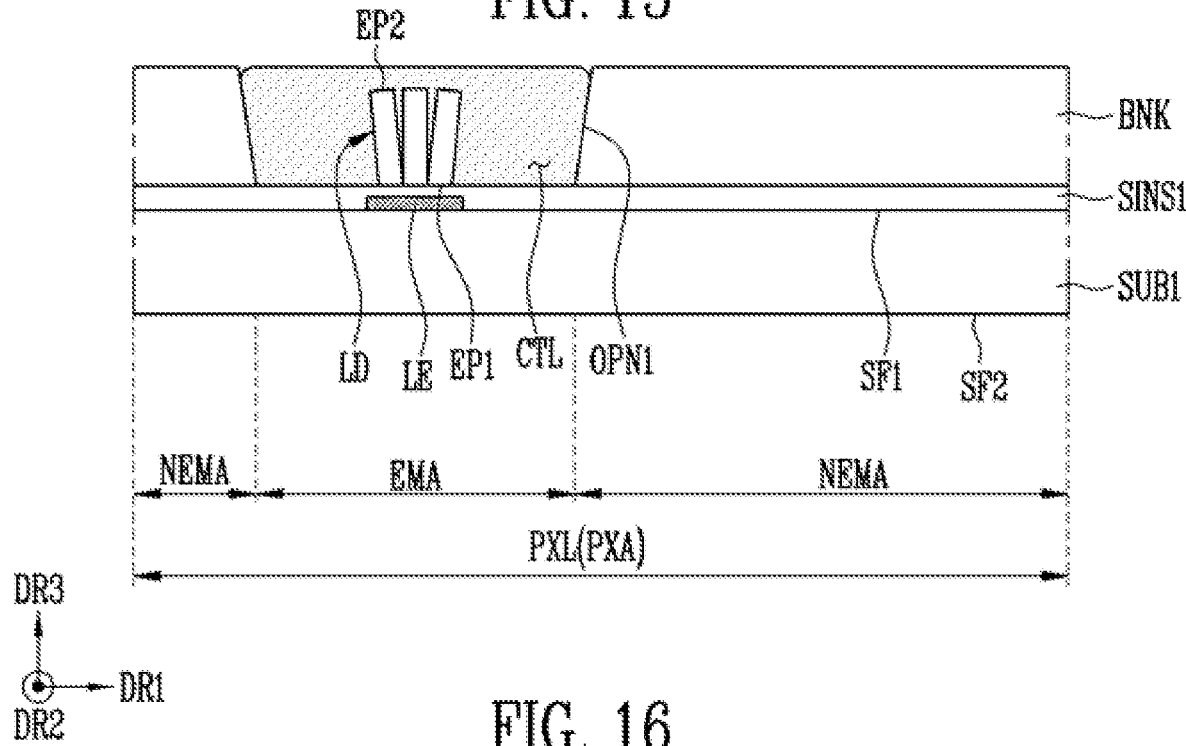
Figure 16:
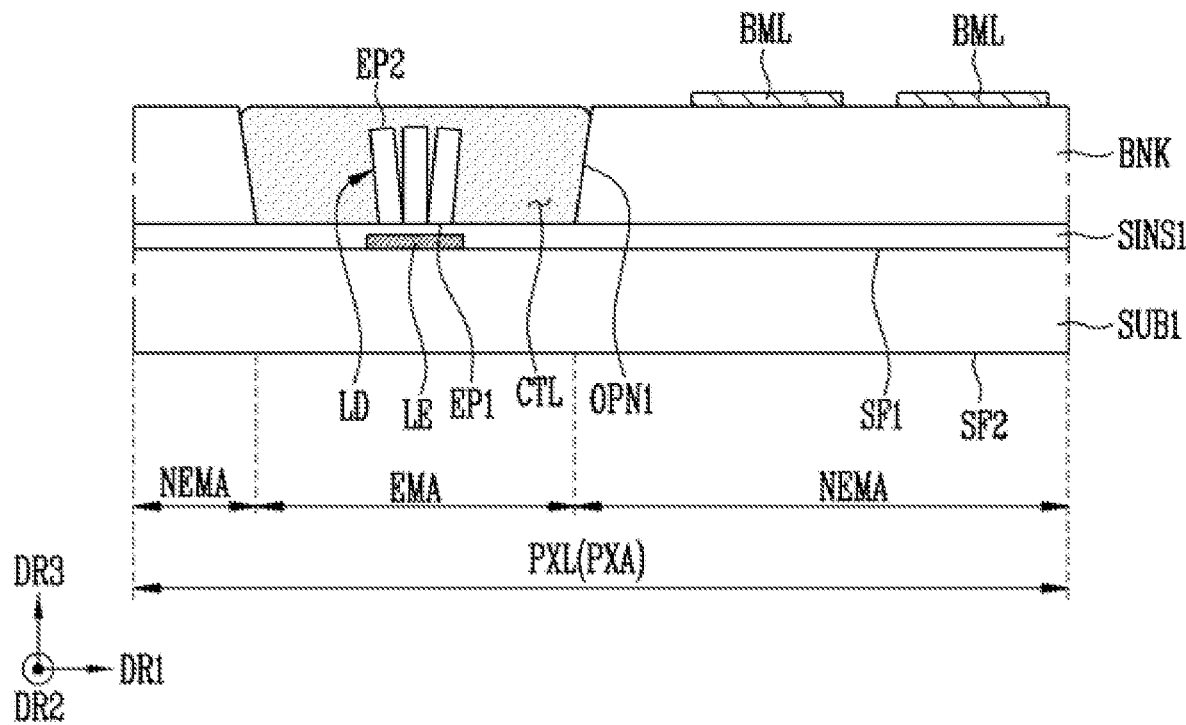
Figure 17:
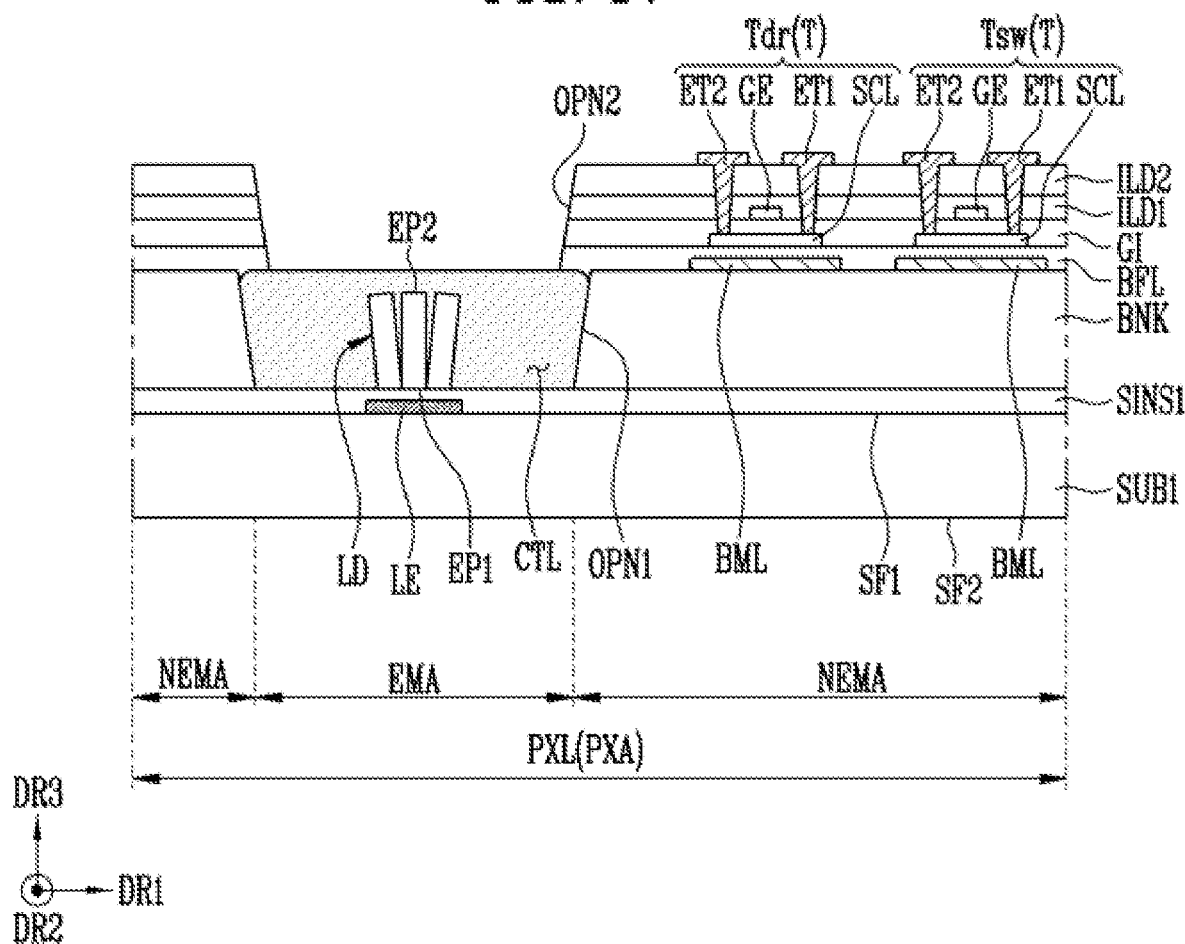

Referring to FIG. 5, FIG. 9, and FIG. 10, the bank BNK including the first opening OPN1 may be formed on the first sub-insulating layer SINS1.

The bank BNK may be a pixel defining film that defines the pixel area PXA (or light emitting area EMA) between the pixel PXL and pixels adjacent thereto (not shown). The first opening OPN1 corresponds to or coincides with the light emitting area EMA of the pixel PXL, and may expose the first sub-insulating layer SINS1 corresponding to the light emitting area EMA. The first opening OPN1 may be an area into which the light emitting elements LD are supplied (or injected).

Referring to FIG. 5 and FIG. 9 to FIG. 11, the light emitting elements LD are injected into the light emitting area EMA of the pixel PXL by using an inkjet printing method or the like within the spirit and the scope of the disclosure. For example, a nozzle is disposed at an upper portion of the first sub-insulating layer SINS1 exposed by the first opening OPN1, and a content INK is injected (or supplied) into the light emitting area EMA of the pixel PXL through the nozzle. The content INK may be provided in a solution state. The content INK may be an ink including a fluid solvent SLV and a plurality of light emitting elements LD included (or dispersed) in the solvent SLV. The solvent SLV may be liquid or fluid, and may have a viscosity such that the light emitting elements LD corresponding to a dispersion material may move in the solvent SLV. The solvent SLV may include a material in which the light emitting elements LD may be easily moved in the solvent SLV by an electric field formed by an electric field former. In an embodiment, the solvent SLV may include an organic material cured by heat or light. The solvent SLV (or the contents INK) may be provided or disposed to fill the first opening OPN1 of the bank BNK.

Referring to FIG. 5 and FIG. 9 to FIG. 12, after preparing a second substrate SUB2 in which an upper electrode UE and a second sub-insulating layer SINK are entirely disposed on one or a surface thereof, the second substrate SUB2 is disposed on the bank BNK and the content INK. For example, the second substrate SUB2 may be disposed on the first substrate SUB1 so that the upper electrode UE disposed on one or a surface thereof faces the bank BNK and the contents INK.

The second substrate SUB2 may include the same or similar material as the first substrate SUB1, or may include one or more selected from the materials exemplified as a constituent material of the first substrate SUB1. The second substrate SUB2 may be a support substrate stably supporting the upper electrode UE during a process of aligning the light emitting elements LD. In an embodiment, the bank BNK may maintain an interval between the first substrate SUB1 and the second substrate SUB2 along with a spacer (not shown). In an embodiment in which the bank BNK is not provided, it is possible to maintain an interval between the first substrate SUB1 and the second substrate SUB2 by only a spacer.

The second sub-insulating layer SINK may include the same or similar material as the first sub-insulating layer SINS1. The second sub-insulating layer SINK may cover or overlap the upper electrode UE to protect the upper electrode UE. The second sub-insulating layer SINK may include a material that may be easily peeled off in a substrate separation process using a laser. In an embodiment, the second sub-insulating layer SINK may be omitted.

In an embodiment, the upper electrode UE may be a second alignment electrode for aligning the light emitting elements LD in the pixel PXL. For example, the upper electrode UE may be an electric field former for forming an electric field in the content INK together with the lower electrode LE. For this purpose, the upper electrode UE may include a conductive material (or substance). The upper electrode UE may include the same or similar material as the lower electrode LE, but the disclosure is not limited thereto.

The upper electrode UE may be entirely disposed on one or a surface of the second substrate SUB2, and an electric field may be formed together with the lower electrode LE in the third direction DR3 (or a vertical direction in a cross-sectional view) only in an area in which the lower electrode LE that may be locally disposed on the first surface SF1 of the first substrate SUB1 may be disposed. The upper electrode UE may be disposed on the lower electrode LE with the content INK therebetween in the third direction DR3 to overlap the lower electrode LE.

Referring to FIG. 5 and FIG. 9 to FIG. 13, an electric field E is formed between the lower electrode LE and the upper electrode UE by applying an alignment signal (or alignment voltage) corresponding to each of the lower electrode LE and the upper electrode UE through an external alignment pad (not shown).

The alignment signal applied to the lower electrode LE and the alignment signal applied to the upper electrode UE may be signals having a voltage difference and/or a phase difference sufficient to form an electric field E between the lower electrode LE and the upper electrode UE. In a case that an AC power source or DC power source having a predetermined voltage and period is repeatedly applied to each of the lower electrode LE and the upper electrode UE several times, an electric field according to a potential difference between the lower electrode LE and the upper electrode UE may be formed between the lower electrode LE and the upper electrode UE. As described above, as the lower electrode LE may be disposed under or below the upper electrode UE with the content INK therebetween, an electric field E may be formed in a vertical direction between the lower electrode LE and the upper electrode UE.

Due to the electric field E formed in the vertical direction, each of the light emitting elements LD dispersed in the fluid solvent SLV may be aligned along the length L direction. In an embodiment, the length L direction may be parallel to the third direction DR3 (or vertical direction in a cross-sectional view). For example, the light emitting elements LD may be aligned in the length L direction (or vertical direction) of the corresponding light emitting element LD.

Due to the electric field E formed in the vertical direction, the light emitting elements LD are aligned in the same direction between the lower electrode LE and the upper electrode UE, so that one of the first and second end portions EP1 and EP2 of each of the light emitting elements LD may be directed to the lower electrode LE and the other thereof may be directed to the upper electrode UE. For example, the first end portion EP1 of each of the light emitting elements LD may be directed to the lower electrode LE, and the second end portion EP2 of each of the light emitting elements LD may be directed to the upper electrode UE. In an embodiment, an n-type semiconductor layer doped with an n-type dopant may be disposed at the first end portion EP1. For example, a p-type semiconductor layer doped with a p-type dopant and an ohmic contact electrode ohmic-contacting the p-type semiconductor layer, for example, an additional electrode (see '15' in FIG. 8A and FIG. 8B) described with reference to FIG. 5 to FIG. 8B may be disposed at the second end portion EP2.

In the above-described alignment process, as the lower electrode LE is locally disposed on the first sub-insulating layer SINS1 in the form of an individual pattern, the light emitting elements LD may be intensively arranged or disposed only in the area in which the lower electrode LE is disposed. Accordingly, the first end portion EP1 of each light emitting element LD directed to the lower electrode LE may be disposed to closely contact the first end portions EP1 of the light emitting elements LD adjacent thereto. In contrast, the second end portion EP2 of each light emitting element LD directed to the upper electrode UE may be disposed to be spaced apart from the second end portions EP2 of the light emitting elements LD adjacent thereto by a predetermined interval. For example, each of the plurality of light emitting elements LD disposed between one or a lower electrode LE and one or an upper electrode UE may include the first end portion EP1 closely disposed to the adjacent light emitting element LD in the lower electrode LE, and the second end portion EP2 disposed to be spaced apart from the adjacent light emitting element LD in the upper electrode UE. The plurality of light emitting elements LD may be aligned between the lower electrode LE and the upper electrode UE in a form in which when viewed in a cross-sectional view, the first end portions EP1 may be clustered (or collected) toward the lower electrode LE, and the second end portions EP2 may be spread toward the upper electrode UE.

Referring to FIG. 5 and FIG. 9 to FIG. 14, the intermediate layer CTL is formed by curing the solvent SLV by irradiating light or applying heat to the solvent SLV provided or disposed to fill the first opening OPN1 of the bank BNK. The intermediate layer CTL formed by curing the solvent SLV may further stably fix the light emitting elements LD aligned in the length L direction. Since the intermediate layer CTL covers or overlaps all of respective outer circumferential surface (or surface) of the light emitting elements LD, respective light emitting elements LD are not exposed to the outside.

Referring to FIG. 5 and FIG. 9 to FIG. 15, the second substrate SUB2 including the upper electrode UE, and the intermediate layer CTL are separated by a substrate separation process. In an embodiment, the substrate separation process may be performed by using a laser lift off method or the like within the spirit and the scope of the disclosure. In a case that laser is irradiated on the second substrate SUB2, the second sub-insulating layer SINK and the intermediate layer CTL may be physically separated. For example, the second sub-insulating layer SINK may lose its adhesive function in a case that the laser is irradiated thereon. The intermediate layer CTL and the bank BNK may be exposed by the above-described substrate separation process.

Referring to FIG. 5 and FIG. 9 to FIG. 16, the bottom layer BML is formed on the bank BNK of the non-light emitting area NEMA of the pixel PXL.

The bottom layer BML may block the light emitted from the light emitting elements LD from being introduced to the pixel circuit layer PCL disposed thereon. For example, the bottom layer BML may include an opaque conductive material having a predetermined reflectivity, or may include a black matrix that blocks and/or absorbs light.

Referring to FIG. 5 and FIG. 9 to FIG. 17, at least one transistor T and the insulating layers including the second opening OPN2 are formed on the bottom layer BML, the bank BNK, and the intermediate layer CTL. In an embodiment, the insulating layers may include the buffer layer BFL, the gate insulating layer GI, the first and second interlayer insulating layers ILD1 and ILD2.

The second opening OPN2 may be formed by removing a portion of the above-described insulating layers corresponding to the light emitting area EMA of the pixel PXL. The second opening OPN2 may correspond to or coincide with the first opening OPN1 of the bank BNK.

Referring to FIG. 5 and FIG. 9 to FIG. 18, the groove HM exposing the second end portion EP2 of each of the light emitting elements LD is formed by removing a portion of the intermediate layer CTL exposed by the second opening OPN2 through an etching process. As the etching process, for example, an ashing process performed in an oxygen plasma atmosphere in order to easily remove a portion of the intermediate layer CTL made of an organic material may be applied, but the disclosure is not limited thereto. In an embodiment, various methods of the etching processes may be applied within a range that does not affect the light emitting elements LD while removing a portion of the intermediate layer CTL.

In a case that a portion of the intermediate layer CTL is removed by performing the above-described ashing process, and in a case that the second end portion EP2 of each of the light emitting elements LD is exposed to the outside, some or a number of constituent elements disposed at the second end portion EP2 of each of the light emitting elements LD may be affected by the plasma used in the ashing process described above, and thus may be removed, but as the additional electrode 15 is disposed at the second end portion EP2, each of the light emitting elements LD may not be directly affected by the plasma.

In a case that the portion of the intermediate layer CTL is removed by performing the above-described ashing process and the second end portion EP2 of each of the light emitting elements LD is exposed to the outside, a contact region between the second end portion EP2 and the first electrode PE (or pixel electrodes) formed by a process to be described later may be further secured.

Referring to FIG. 5 and FIG. 9 to FIG. 19, the first electrode PE (or pixel electrode) is formed in the second opening OPN2. The first electrode PE (or pixel electrode) may include a transparent conductive material (or substance).

The first electrode PE (or pixel electrode) may be provided or disposed in the second opening OPN2 to electrically contact the second end portion EP2 of each of the light emitting elements LD exposed to the outside. For example, the first electrode PE (or pixel electrode) may electrically contact the second terminal ET2 of the driving transistor Tdr. The first electrode PE (or pixel electrode) may electrically connect the second end portion EP2 of each of the light emitting elements LD and the driving transistor Tdr.

In an embodiment, the first electrode PE (or pixel electrode) may be used as a driving electrode for driving the light emitting elements LD. The first electrode PE (or pixel electrode) may be an anode.

Referring to FIG. 5 and FIG. 9 to FIG. 20, the first insulating layer INS1 is entirely formed on the first electrode PE (or pixel electrode) and the second interlayer insulating layer ILD2. The first insulating layer INS1 may cover or overlap the first electrode PE (or pixel electrode) to prevent corrode of the first electrode PE (or pixel electrode). In an embodiment, the first insulating layer INS1 may include an inorganic insulating film including an inorganic material.

The encapsulation layer ENC may be formed or disposed on the first insulating layer INS1. The encapsulation layer ENC may include the second insulating layer INS2 and the protective film PTF.

The second insulating layer INS2 may be formed on the first insulating layer INS1 to reduce a step caused by the constituent elements disposed thereunder, for example, the pixel circuit layer PCL. The second insulating layer INS2 may be configured of an organic insulating film containing an organic material. In an embodiment, the second insulating layer INS2 may improve mechanical strength of the pixel circuit layer PCL in the process of manufacturing the second electrode CE (or common electrode).

The protective film PTF may be entirely provided or disposed on the second insulating layer INS2 to prevent impurity penetration and to serve as a buffer from external impact.

Referring to FIG. 5, FIGS. 9 to 21, and FIG. 24, in order to remove the first substrate SUB1 including the lower electrode LE, the first substrate SUB1 is vertically rotated so that the first surface SF1 of the first substrate SUB1 is downwardly directed and the second surface SF2 facing the first surface SF1 is upwardly directed. Accordingly, the protective film PTF may face downward in the third direction DR3.

Subsequently, the substrate separation process is performed to separate the first substrate SUB1 including the lower electrode LE, and the intermediate layer CTL. In an embodiment, the substrate separation process may be performed by using a laser lift off method or the like within the spirit and the scope of the disclosure. In a case that laser is irradiated on the second surface SF2 of the first substrate SUB1, the first sub-insulating layer SINS1 and the intermediate layer CTL may be physically separated. For example, the first sub-insulating layer SINS1 may lose its adhesive function in a case that the laser is irradiated thereon. The bank BNK and the intermediate layer CTL may be exposed by the above-described substrate separation process. For example, the first end portion EP1 of each of the light emitting elements LD may be exposed by the above-described substrate separation process.

In an embodiment, after the above-described substrate separation process is performed, another portion of the intermediate layer CTL exposed to the outside through the etching process may be removed, as shown in FIG. 24, to form the additional groove AHM exposing the first end portion EP1 of each of the light emitting elements LD. As the above-described etching process, for example, an ashing process performed in an oxygen plasma atmosphere may be applied, but the disclosure is not limited thereto.

In a case that another portion of the intermediate layer CTL is removed by performing the above-described ashing process to expose the first end portion EP1 of each of the light emitting elements LD to the outside, a contact region between the first end portion EP1 and the second electrode CE (or common electrodes) formed by a process to be described later may be further secured. Accordingly, as a thickness of the intermediate layer CTL in the third direction DR3 becomes thin, respective end portions EP1 and EP2 of each of the light emitting elements LD, the first electrode PE (or pixel electrode), and the second electrode CE (or common electrode) may further easily contact each other.

Referring to FIG. 5 and FIG. 9 to FIG. 22, the second electrode CE (or common electrode) is entirely formed on the bank BNK and the intermediate layer CTL.

The second electrode CE (or common electrode) is a common layer commonly provided to the pixel PXL and adjacent pixels thereto (not shown), and may be applied with the voltage of the second driving power source (see 'VS S' in FIG. 4). The second electrode CE (or common electrode) may electrically contact the first end portion EP1 of each of the exposed light emitting elements LD. The second electrode CE (or common electrode) may be used as a driving electrode for driving the light emitting elements LD together with the first electrode PE (or pixel electrode). The second electrode CE (or common electrode) may be a cathode.

In an embodiment, the second electrode CE (or common electrode) may include an opaque conductive material (or substance) having a constant reflectivity. The second electrode CE (or common electrode) may be utilized as a light guide member (or reflective member) that guides light proceeding to the first end portion EP 1 each of the light emitting elements LD to the image display direction (for example, the front direction) of the display device.

The third insulating layer INS3 is entirely formed on the second electrode CE (or common electrode). The third insulating layer INS3 may entirely cover or overlap the second electrode CE (or common electrode) to protect the second electrode CE (or common electrode).

Referring to FIG. 5 and FIG. 9 to FIG. 23, the third insulating layer INS3 is rotated up and down so that the protective film PTF faces upward and the second electrode CE (or common electrode) faces downward, in the third direction DR3.

In the pixel PXL finally manufactured through the above-described manufacturing process, the light emitting elements LD are aligned in the vertical direction, so that light is emitted from the entire area in which the active layer (see '12' in FIG. 8A and FIG. 8B) of each light emitting element LD is disposed, thus the light emission efficiency may be further improved.

Figure 25:
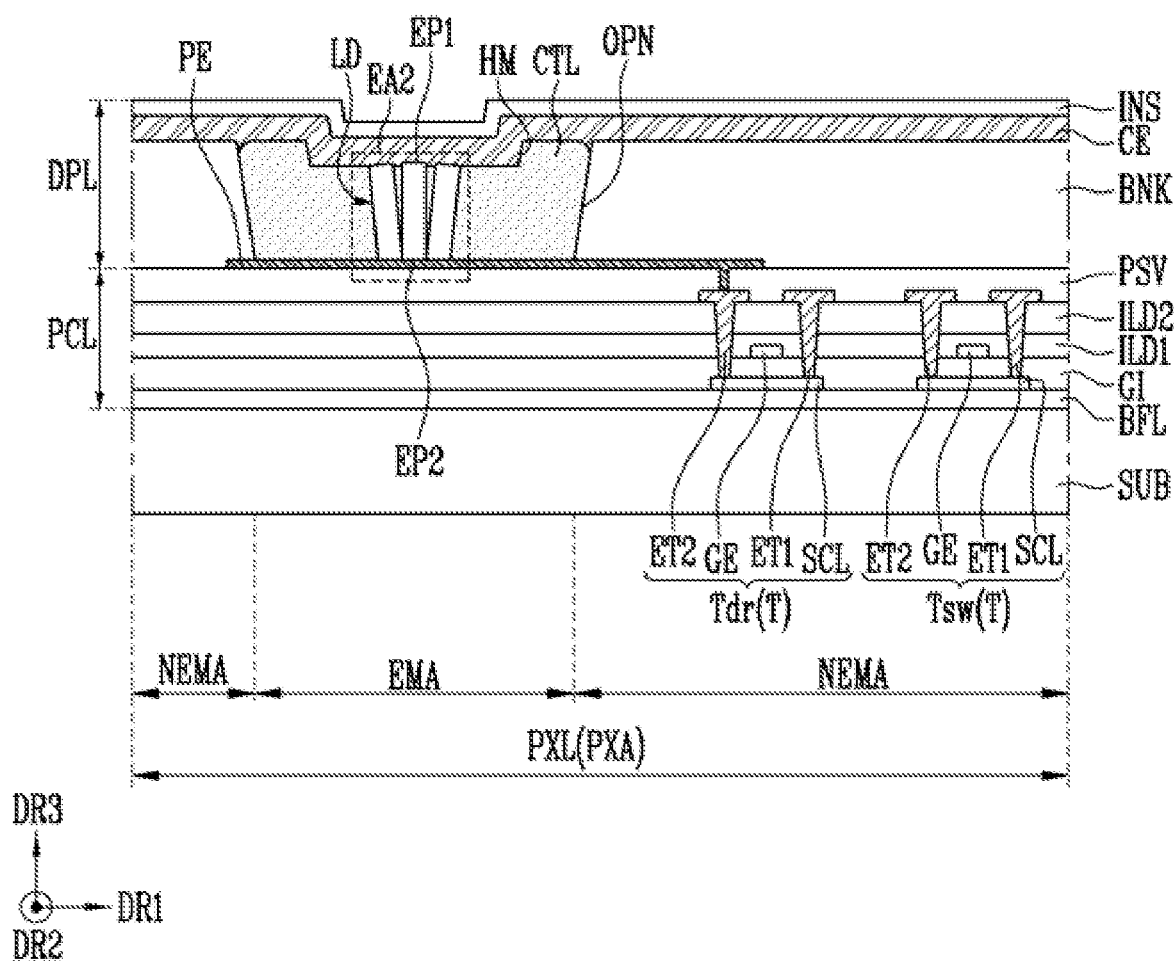
FIG. 25 illustrates a schematic cross-sectional view of a pixel according to an embodiment.
Figure 26:
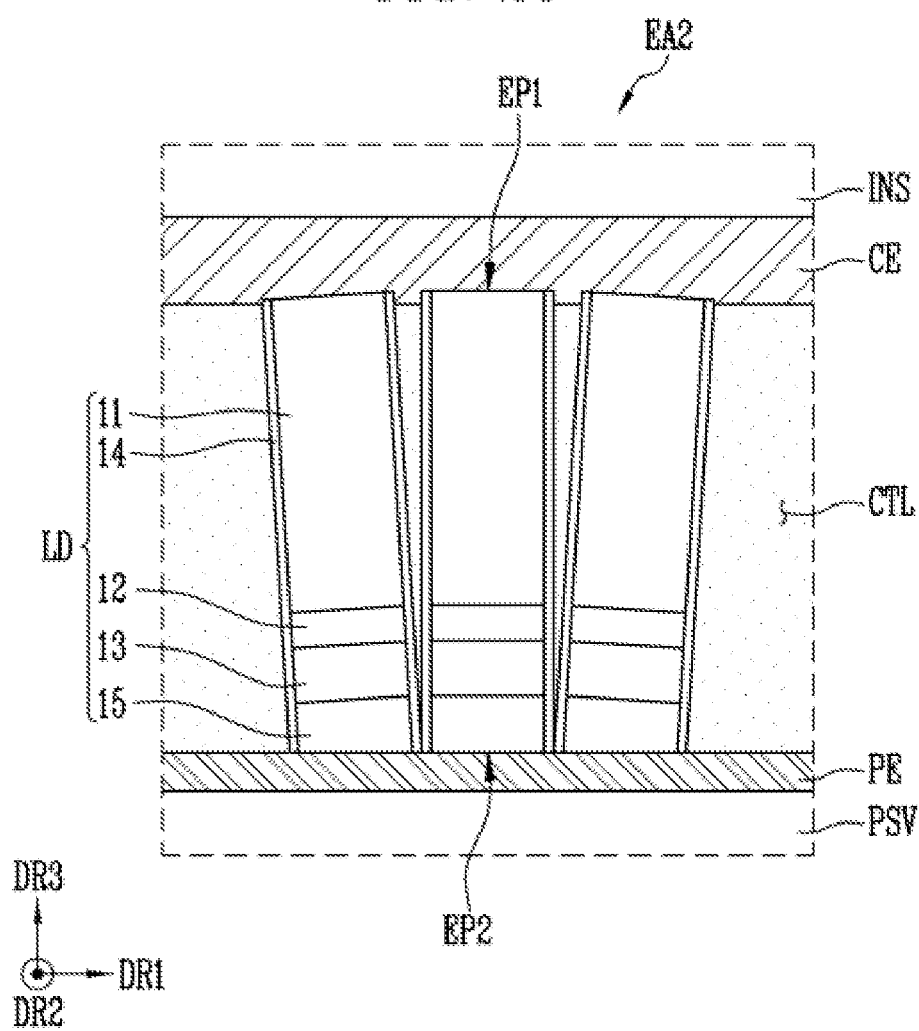
FIG. 26 and FIG. 27 illustrate schematic enlarged views of the portion EA2 of FIG. 25.
Figure 27:
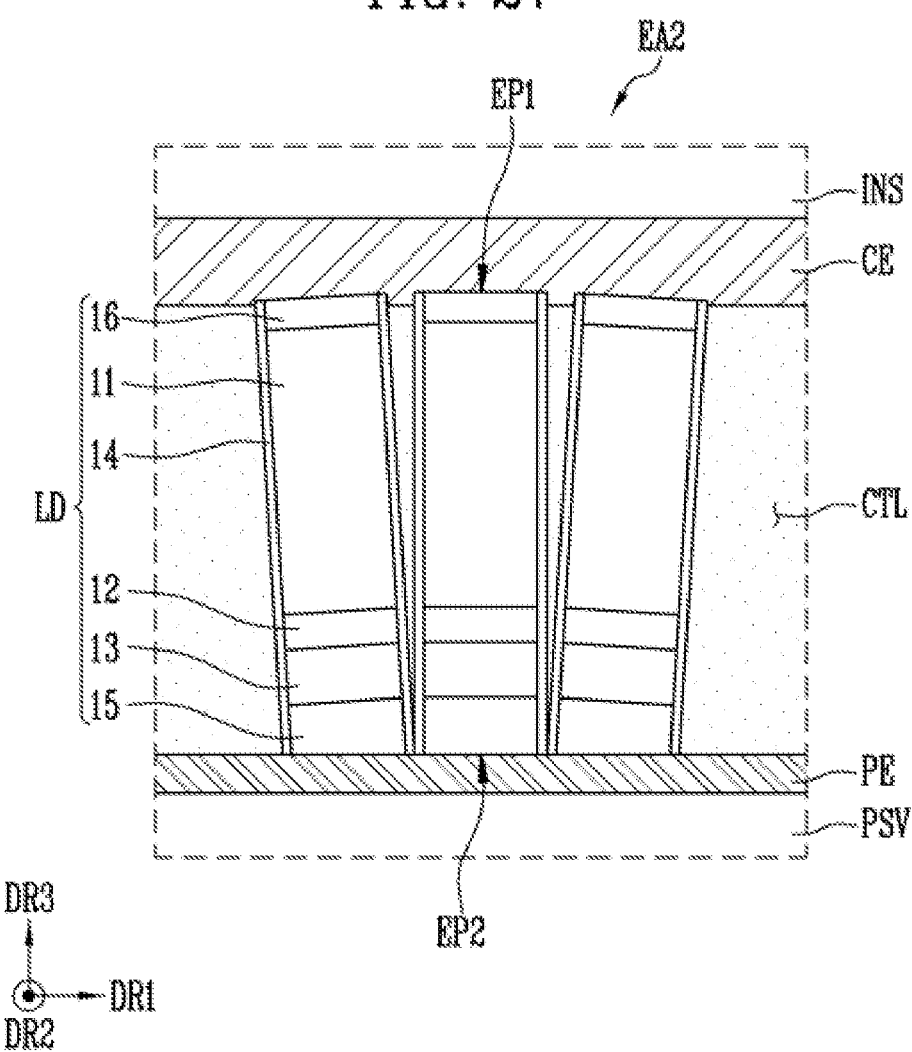

FIG. 25 illustrates a schematic cross-sectional view of a pixel according to an embodiment, and FIG. 26 and FIG. 27 illustrate schematic enlarged views of the portion EA2 of FIG. 25.

In relation to the pixel of FIG. 25 to FIG. 27, differences from the above-described embodiment will be described in order to avoid duplicate descriptions. In an embodiment, constituent elements not specifically described in the disclosure refer to an embodiment described above, the same reference numerals designate the same constituent elements, and the similar reference numerals designate the similar constituent elements.

In FIG. 25 to FIG. 27, the first to third directions DR1, DR2 and DR3 may mean directions indicated by the first to third directions DR1, DR2, and DR3, respectively.

Referring to FIG. 25 to FIG. 27, the pixel PXL according to an embodiment may include the substrate SUB, the pixel circuit layer PCL, and the display element layer DPL.

The substrate SUB may be a rigid substrate or flexible substrate including a transparent insulating material. The substrate SUB may include the pixel area PXA in which the pixel PXL may be provided or disposed. The pixel area PXA may include the light emitting area EMA and the non-light emitting area NEMA.

The pixel circuit layer PCL may include the buffer layer BFL, and the pixel circuit (see "PXC" in FIG. 4) including at least one transistor T, and the passivation layer PSV.

The buffer layer BFL may prevent impurities from spreading into the transistor T.

The transistor T may include a driving transistor Tdr for controlling a driving current of the light emitting elements LD and a switching transistor Tsw electrically connected to the driving transistor Tdr. Each of the driving transistor Tdr and the switching transistor Tsw may include the semiconductor pattern SCL, the gate electrode GE, and the first and second terminals ET1 and ET2.

The passivation layer PSV may be included on the transistor T.

The passivation layer PSV may be provided to include an organic insulating film, an inorganic insulating film, or the organic insulating layer disposed on the inorganic insulating film. The inorganic insulating film may include, for example, at least one of metal oxides such as a silicon nitride ($SiN_x$), a silicon oxide ($SiO_x$), a silicon oxynitride ($SiO_xN_y$), and an aluminum oxide ($AlO_x$). The organic insulating film may be, for example, at least one of a polyacrylates resin, an epoxy resin, a phenolic resin, a polyamides resin, a polyimides resin, an unsaturated polyesters resin, a poly-phenylene ethers resin, a poly-phenylene sulfides resin, and a benzocyclobutene resin.

In an embodiment, the passivation layer PSV may be partially opened to expose the second terminal ET2 of the driving transistor Tdr.

The display element layer DPL may be provided or disposed and/or formed on the passivation layer PSV.

The display element layer DPL may include the first electrode PE (or pixel electrode), the bank BNK, the light emitting elements LD, the intermediate layer CTL, the second electrode CE (or common electrode), and an insulating layer INS.

The first electrode PE (or pixel electrode) may be provided or disposed on the passivation layer PSV, and may electrically contact the second terminal ET2 of the driving transistor Tdr exposed by the passivation layer PSV to be electrically connected to the driving transistor Tdr. The first electrode PE (or pixel electrode) may be provided or disposed on the passivation layer PSV to correspond to the light emitting area EMA of the pixel PXL.

In an embodiment, the first electrode PE (or pixel electrode) may be a light guide member (or reflective member) that guides light emitted from the light emitting elements LD to an image display direction (for example, a front direction) of the display device. For this purpose, the first electrode PE (or pixel electrode) may be made of a conductive material (or substance) having a constant reflectivity. The conductive material (or substance) may include an opaque metal. The first electrode PE (or pixel electrode) may include the same or similar material as the second electrode CE (or common electrode) described with reference to FIG. 5 to FIG. 8B, or may include one or more selected from the materials exemplified as the constituent materials of the second electrode CE (or common electrode).

The first electrode PE (or pixel electrode) may electrically contact one or an end portion of each of the light emitting elements LD to be electrically connected to the light emitting elements LD. For example, the first electrode PE (or pixel electrode) may electrically contact the second end portion EP2 of each of the light emitting elements LD to be electrically connected to the light emitting elements LD.

The bank BNK may be disposed in the non-light emitting area NEMA of the pixel PXL, and may be a pixel defining film that may be a structure that defines (or partitions) the pixel area PXA or the light emitting area EMA of each of the pixel PXL and pixels adjacent thereto (not shown). The bank BNK may be a pixel defining film or a dam structure that defines the light emitting area EMA in which the light emitting elements LD should be supplied in a process of supplying (or injecting) light emitting elements LD to the pixel PXL.

The bank BNK may include at least one light blocking material and/or reflective material to prevent a light leakage defect in which light leaks between the pixel PXL and pixels adjacent thereto. The bank BNK may include the opening OPN exposing a portion of the first electrode PE (or pixel electrode). The opening OPN may correspond to the light emitting area EMA of the pixel PXL.

The light emitting elements LD may be arranged or disposed and/or provided in the light emitting area EMA of the pixel PXL. Each of the light emitting elements LD may be a light emitting diode having a size as small as a nano-scale or a micro-scale.

Each of the light emitting elements LD may include a light emitting stacked pattern in which the additional electrode 15, the second semiconductor layer 13, the active layer 12, and the first semiconductor layer 11 may be sequentially stacked each other along the length L direction as shown in FIG. 26, and the insulating film 14 surrounding an outer circumferential surface of the light emitting stacked pattern. The first semiconductor layer 11 may be an n-type semiconductor layer doped with an n-type dopant, and the second semiconductor layer 13 may be a p-type semiconductor layer doped with a p-type dopant. The additional electrode 15 may be an ohmic contact electrode ohmic-contacting the second semiconductor layer 13, but the disclosure is not limited thereto. In an embodiment, the additional electrode 15 may be a Schottky contact electrode.

In an embodiment, each of the light emitting elements LD may include a light emitting stacked pattern in which the first additional electrode 15, the second semiconductor layer 13, the active layer 12, the first semiconductor layer 11, and a second additional electrode 16 may be sequentially stacked each other along the length L direction as shown in FIG. 27, and an insulating film 14 surrounding an outer circumferential surface of the light emitting stacked pattern. The first additional electrode 15 may be an ohmic contact electrode ohmic-contacting the second semiconductor layer 13, and the second additional electrode 16 may be an ohmic contact electrode ohmic-contacting the first semiconductor layer 11.

Each of the light-emitting elements LD may be arranged or disposed between the first electrode PE (or pixel electrode) and the second electrode CE (or common electrode) so that the length L direction of the corresponding light emitting element LD is parallel to the third direction DR3 (or perpendicular direction when viewed in a cross-sectional view).

In an embodiment, each of the light emitting elements LD may include the first end portion EP1 and the second end portion EP2 facing each other in the length L direction. In an embodiment, the first end portion EP1 may be disposed at the upper end portion of the light emitting element LD in the length L direction, and the second end portion EP2 may be disposed at the lower end portion of the light emitting element LD in the length L direction. As shown in FIG. 26, the first semiconductor layer 11 of each of the light emitting elements LD may be disposed at the first end portion EP1 of the corresponding light emitting element LD, and the second semiconductor layer 13 and the additional electrode 15 of each of the light emitting elements LD may be disposed at the second end portion EP2 of the corresponding light emitting element LD. The first semiconductor layer 11 of each of the light emitting elements LD may be disposed at the upper end portion of the corresponding light emitting element LD, and the additional electrode 15 of each of the light emitting elements LD may be disposed at the lower end portion of the corresponding light emitting element LD. For example, as shown in FIG. 27, the first semiconductor layer 11 and the second additional electrode 16 of each of the light emitting elements LD may be disposed at the first end portion EP1 of the corresponding light emitting element LD, and the second semiconductor layer 13 and the first additional electrode 15 of each of the light emitting elements LD may be disposed at the second end portion EP2 of the corresponding light emitting element LD. The second semiconductor layer 16 of each of the light emitting elements LD may be disposed at the upper end portion of the corresponding light emitting element LD, and the first additional electrode 15 of each of the light emitting elements LD may be disposed at the lower end portion of the corresponding light emitting element LD.

The intermediate layer CTL may be disposed between the first electrode PE (or pixel electrode) and the second electrode CE (or common electrode), and may be provided or disposed to cover or overlap the light emitting elements LD. The intermediate layer CTL may be provided or disposed in the light emitting area EMA of the pixel PXL, and may be provided or disposed to fill between the first electrode PE (or pixel electrode) and the second electrode CE (or common electrode). For example, the intermediate layer CTL may be provided or disposed to fill the opening OPN of the bank BNK.

After a fluid solution (or mixing solution) in which the light emitting elements LD are dispersed is supplied (or injected) into the light emitting area EMA of the pixel PXL, and the light emitting elements LD are arranged, the intermediate layer CTL may be cured by heat or light to be formed and/or provided or disposed. The intermediate layer CTL may be provided or disposed to fill the opening OPN of the bank BNK to be cured in the first opening OPN after the alignment of the light emitting elements LD is completed.

The intermediate layer CTL may include, for example, at least one of a photocurable resin including a photo polymerization initiator crosslinked and cured by light such as UV and a thermosetting polymer resin including a thermal polymerization initiator that initiates a curing reaction by heat. The intermediate layer CTL may stably fix the light emitting elements LD aligned in the third direction DR3 and prevent the light emitting elements LD from being separated from each other. In an embodiment, the intermediate layer CTL may include a groove HM exposing an upper end portion of each of the light emitting elements LD to the outside. The first semiconductor layer 11, as shown in FIG. 26, may be disposed, or the second additional electrode 16, as shown in FIG. 27, may be disposed, at the upper end portion of each of the light emitting elements LD exposed by the groove HM of the intermediate layer CTL, for example, at the first end portion EP1.

The second electrode CE (or common electrode) may be entirely provided or disposed and/or formed on the bank BNK and the intermediate layer CTL.

The second electrode CE (or common electrode) may be a common layer commonly provided to the pixel PXL and pixels adjacent to the pixel PXL. In an embodiment, the second electrode CE (or common electrode) may be a cathode. The second electrode CE (or common electrode) may be electrically connected to the second driving power source (see 'VSS' in FIG. 4), so that a voltage of the second driving power source VSS may be transmitted to the second electrode CE (or common electrode).

The second electrode CE (or common electrode) may electrically contact the first end portion EP1 of each of the light emitting elements LD exposed by the groove HM of the intermediate layer CTL. For example, the second electrode CE (or common electrode) may electrically contact, as shown in FIG. 26, the first semiconductor layer 11 of each of the light emitting elements LD, or may electrically contact, as shown in FIG. 27, the second additional electrode 16 of each of the light emitting elements LD.

The second electrode CE (or common electrode) may be made of various transparent conductive materials (or substances) in order to proceed light that may be emitted from each of the light emitting elements LD and reflected in a target direction by the first electrode PE (or pixel electrode) to the image display direction of the display device without loss. For example, the second electrode CE (or common electrode) may at least one of various transparent conductive materials (or substances) such as an indium tin oxide (ITO), an indium zinc oxide (IZO), a zinc oxide (ZnO), an indium gallium zinc oxide (IGZO), and an indium tin zinc oxide (ITZO), and may be formed to be substantially transparent or translucent to satisfy a predetermined light transmittance (or transmittance). However, the material of the second electrode CE (or common electrode) is not limited to the above-described embodiment.

The insulating layer INS may be provided or disposed and/or formed on the second electrode CE (or common electrode).

The insulating layer INS may be provided or disposed and/or formed on the second electrode CE (or common electrode) to protect the second electrode CE (or common electrode). The insulating layer INS may be an inorganic insulating film including an inorganic material. For example, the insulating layer INS may include at least one of metal oxides such as a silicon nitride ($SiN_x$), a silicon oxide ($SiO_x$), a silicon oxynitride ($SiO_xN_y$), and an aluminum oxide ($AlO_x$). However, the material of the insulating layer INS is not limited to the above-described embodiments. In an embodiment, the insulating layer INS may be an organic insulating film including an organic material. The insulating layer INS may be provided as a single film, and may be provided as a multi-film of at least two or more films.

In an embodiment, the display element layer DPL may selectively further include an optical layer in addition to the insulating layer INS. As an example, the display element layer DPL may further include a color conversion layer including color conversion particles that may convert light emitted from the light emitting elements LD into light of a specific or predetermined color.

According to an embodiment, at least one overcoat layer (for example, a layer flattening the upper surface of the display element layer DPL) may be further disposed on the insulating layer INS.

According to the above-described embodiment, as the light emitting elements LD are aligned in the vertical direction (for example, third direction DR3) between the first electrode PE (or pixel electrode) and the second electrode CE (or common electrode), the area occupied by the light emitting elements LD in the pixel area PXA (or light emitting area EMA) of the pixel PXL is reduced, so that the alignment area of the light emitting elements LD may be further secured.

For example, according to the above-described embodiment, since the support member, for example, a reflective partition wall, for guiding the light emitted from the light emitting elements LD in a target direction may be omitted, the spatial efficiency of the pixel area PXA may be improved. Therefore, since spatial constraint between the constituent elements included in the pixel PXL, for example, a critical dimension (CD) (a line width of each of the electrodes, or a width of the gap between the electrodes') constraint between the electrodes included in the pixel PXL are reduced, a high resolution and high definition display device may be easily implemented.

While the disclosure has been shown and described with reference to embodiments thereof, it will be understood by those skilled in the art that various changes in forms and details may be made therein without departing from the spirit and scope of the disclosure as defined by the appended claims and their equivalents.

What is claimed is:

1. A display device comprising:
  pixels, wherein each of the pixels includes:
    a base layer;
    an encapsulation layer disposed on the base layer;
    light emitting elements disposed between the base layer and the encapsulation layer, each of the light emitting elements including a first end portion and a second end portion disposed in a length direction;
    an intermediate layer disposed between the base layer and the encapsulation layer and including a single groove that exposes a portion of each of the light emitting elements, the intermediate layer fixing each of the light emitting elements in the length direction;
    a pixel circuit layer disposed between the intermediate layer and the encapsulation layer and including at least one transistor electrically connected to one of the first end portion and the second end portion of each of the light emitting elements;
    a first electrode disposed between the pixel circuit layer and the light emitting elements, disposed between the at least one transistor and the encapsulation layer, and electrically connecting the one of the first end portion and the second end portion of each of the light emitting elements to the at least one transistor; and
    a second electrode disposed between the base layer and the light emitting elements and electrically connected to the other of the first end portion and the second end portion of each of the light emitting elements, and
  wherein the first electrode and the second electrode include different materials and are disposed in different layers.

2. The display device of claim 1, wherein
  one of the first electrode and the second electrode includes a transparent conductive material, and
  the other of the first electrode and the second electrode includes an opaque conductive material.

3. The display device of claim 2, wherein the intermediate layer includes a curable material.

4. The display device of claim 3, wherein
  the pixel circuit layer is disposed on the light emitting elements and the intermediate layer,
  the first electrode is disposed above the light emitting elements, and the second electrode is disposed below the light emitting elements,
  the first electrode is disposed on the second electrode, and
  the light emitting elements are disposed between the first electrode and the second electrode.

5. The display device of claim 4, wherein
  the first electrode includes a transparent conductive material, and
  the second electrode includes an opaque conductive material.

6. The display device of claim 5, wherein the second electrode reflects light emitted from the light emitting elements in an upper direction of the light emitting elements.

7. The display device of claim 5, wherein each of the light emitting elements includes:
  a first semiconductor layer contacting the first electrode and electrically connected to the first electrode;
  a second semiconductor layer contacting the second electrode and electrically connected to the second electrode; and
  an active layer disposed between the first semiconductor layer and the second semiconductor layer, wherein
  the first semiconductor layer is a p-type semiconductor layer doped with a p-type dopant, and
  the second semiconductor layer is an n-type semiconductor layer doped with an n-type dopant.

8. The display device of claim 7, wherein
  the first end portion of each of the light emitting elements is disposed at an upper end portion of a corresponding light emitting element along the length direction,
  the second end portion of each of the light emitting elements is disposed at a lower end portion of the corresponding light emitting element along the length direction;
  the first semiconductor layer is disposed at the first end portion of each of the light emitting elements, and
  the second semiconductor layer is disposed at the second end portion of each of the light emitting elements.

9. The display device of claim 8, wherein
  the pixel circuit layer includes at least one insulating layer,
  the at least one insulating layer includes a first opening in which a portion is removed from an area overlapping the light emitting elements, and
  the first electrode is disposed on the first end portion of each of the light emitting elements within the first opening of the at least one insulating layer.

10. The display device of claim 9, further comprising:
  a conductive pattern disposed on at least a portion of the first electrode within the first opening of the at least one insulating layer,
  wherein the conductive pattern does not overlap the light emitting elements in a cross-sectional view.

11. The display device of claim 9, further comprising:
  a bank disposed between the second electrode and the pixel circuit layer, surrounding the light emitting elements, and including a second opening exposing a portion of the second electrode;
  a first passivation layer overlapping the first electrode;
  a second passivation layer disposed on the first passivation layer; and
  a third passivation layer overlapping the second electrode,
  wherein the intermediate layer fills the second opening of the bank, and
  wherein the groove exposes the first end portion of each of the light emitting elements.

12. The display device of claim 11, wherein the first opening of the at least one insulating layer coincides with the second opening.

13. The display device of claim 11, wherein
the intermediate layer is disposed between the second electrode and the pixel circuit layer, and
the groove exposes the first end portion of each of the light emitting elements.

14. The display device of claim 11, wherein the pixel circuit layer is disposed between the bank and the encapsulation layer and includes a light blocking member overlapping the at least one transistor.

15. The display device of claim 3, further comprising:
a substrate on which the pixels are disposed, wherein
the pixel circuit layer is disposed between the substrate and the light emitting elements,
the first electrode is disposed below the light emitting elements,
the second electrode is disposed above the light emitting elements,
the second electrode is disposed on the first electrode, and
the light emitting elements are disposed between the first electrode and the second electrode.

16. The display device of claim 15, wherein
the first electrode includes an opaque conductive material,
the second electrode includes a transparent conductive material, and
the first electrode reflects light emitted from the light emitting elements in an upper direction of the light emitting elements.

17. The display device of claim 16, wherein
each of the light emitting elements includes:
a p-type semiconductor layer doped with a p-type dopant, the p-type semiconductor layer contacting the first electrode and electrically connected to the first electrode;
a n-type semiconductor layer doped with a n-type dopant, the n-type semiconductor layer contacting the second electrode and electrically connected to the second electrode; and
an active layer disposed between the p-type semiconductor layer and the n-type semiconductor layer,
the p-type semiconductor layer directly contacts the first electrode and/or the n-type semiconductor layer directly contacts the second electrode,
the first end portion of each of the light emitting elements is disposed at a lower end portion of a corresponding light emitting element along the length direction,
the second end portion of each of the light emitting elements is disposed at an upper end portion of the corresponding light emitting element along the length direction,
the p-type semiconductor layer is disposed at the first end portion of each of the light emitting elements, and
the n-type semiconductor layer is disposed at the second end portion of each of the light emitting elements.

* * * * *